(12) United States Patent
Janett et al.

(10) Patent No.: US 11,165,429 B2
(45) Date of Patent: Nov. 2, 2021

(54) OPERATING A SUPERCONDUCTING CHANNEL BY ELECTRON INJECTION

(71) Applicant: International Business Machines Corporation, Armonk, NY (US)

(72) Inventors: Andreas Fuhrer Janett, Zurich (CH); Fabrizio Nichele, Zurich (CH); Markus Fabian Ritter, Adliswil (CH); Heike Erika Riel, Baech (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/831,241

(22) Filed: Mar. 26, 2020

(65) Prior Publication Data
US 2021/0305987 A1  Sep. 30, 2021

(51) Int. Cl.
*H03K 19/195* (2006.01)
*G06N 10/00* (2019.01)
(Continued)

(52) U.S. Cl.
CPC ......... *H03K 19/1954* (2013.01); *G06N 10/00* (2019.01); *H01L 39/228* (2013.01); *H03K 17/92* (2013.01)

(58) Field of Classification Search
CPC .... H03K 17/92; H03K 19/1954; G06N 10/00; H01L 39/228
See application file for complete search history.

(56) References Cited

U.S. PATENT DOCUMENTS

| 2,832,897 A | 4/1958 | Buck |
| 5,274,249 A | 12/1993 | Xi et al. |

(Continued)

FOREIGN PATENT DOCUMENTS

| EP | 0523279 A1 | 1/1993 |
| JP | H06151988 A | 5/1994 |

OTHER PUBLICATIONS

Paolucci, et al.("Field-Effect Control of Metallic Superconducting Systems," arXiv:1909.12721v2 [cond-mat.mes-hall] Jan. 7, 2020, https://arxiv.org/pdf/1909.12721.pdf, 19 pages) (Year: 2020).*

(Continued)

*Primary Examiner* — Patrick C Chen
(74) *Attorney, Agent, or Firm* — Amin, Turocy & Watson, LLP

(57) ABSTRACT

The invention is notably directed to a method of operating a superconducting channel. The method relies on a device including: a potentially superconducting material; a gate electrode; and an electrically insulating medium. A channel is defined by the potentially superconducting material. The gate electrode positioned adjacent to the channel, such that an end surface of the gate electrode faces a portion of the channel. The electrically insulating medium is arranged in such a manner that it electrically insulates the gate electrode from the channel. Rendering the channel superconducting by cooling down the device. Next, a voltage difference is applied between the gate electrode and the channel to inject electrons in the channel through the electrically insulating medium and thereby generate a gate current between the gate electrode and the channel. The electrons are injected with an average energy sufficient to modify a critical current $I_C$ of the channel.

12 Claims, 15 Drawing Sheets

(51) Int. Cl.
*H03K 17/92* (2006.01)
*H01L 39/22* (2006.01)

(56) References Cited

U.S. PATENT DOCUMENTS 9,627,045 B1 4/2017 Mukhanov et al.
2016/0028403 A1* 1/2016 McCaughan ......... H01L 39/125
326/7

OTHER PUBLICATIONS

Giazotto et al., "Josephson tunnel junction controlled by quasiparticle injection", Journal of Applied Physics, vol. 97, 023908, 2005, 5 pages.
Paolucci, et al., "Field-Effect Control of Metallic Superconducting Systems," arXiv:1909.12721v2 [cond-mat.mes-hall] Jan. 7, 2020, https://arxiv.org/pdf/1909.12721.pdf, 19 pages.
Murani, et al., "Long-to Short-Junction Crossover and Field-Reentrant Critical Current in Al/Ag-NanowireslAl Josephson Junctions," arXiv:1911.02962v1 [cond-mat.mes-hall] Nov. 7, 2019, https://arxiv.org/pdf/1911.02962.pdf, 8 pages.
Hohenwarter, "Superconducting High TC Thin Film Vortex-Flow Transistor," Sponsored Research Report (1991), https://apps.dtic.mil/dtic/tr/fulltext/u2/a235025.pdf, 29 pages.
Matisoo, "The Tunneling Cryotron—A Superconductive Logic Element Based on Electron Tunneling," Proc. IEEE, vol. 55, No. 2, Feb. 1967, p. 172.
Quaranta, et al., "Superconductive Three-Terminal Amplifier/Discriminator," IEEE Trans. Appl. Supercond., vol. 19, No. 3 (2009) p. 367.

Morpurgo, et al., "Hot electron tunable supercurrent," Appl. Phys. Lett. 72, 966 (1998); https://doi.org/10.1063/1.120612, 4 pages.
Vissers, et al., "Frequency-tunable superconducting resonators via nonlinear kinetic inductance," Appl. Phys. Lett. 107, 062601 (2015); https://doi.org/10.1063/1.4927444, 5 pages.
Wagner, et al., "Demonstration of a superconducting nanowire microwave switch," Appl. Phys. Lett. 115, 172602 (2019), 6 pages.
Faris, et al. "Quiteron" IEEE Transactions on Magnetics ( vol. 19 , Issue: 3 , May 1983 ). 11 pages.
Zhao, et al. "Metal—semiconductor—metal GaN ultraviolet photodetectors on Si(111)." Applied Physics Letters 77, 444 (2000); doi: 10.1063/1.127004. 4 pages.
Wong. "Quasiparticle-Injection-Induced Superconducting Weak Links." Physical Review Letters, vol. 37, Jul. 1976. 4 pages.
McCaughan, et al. "A Superconducting-Nanowire Three-Terminal Electrothermal Device." Nano Lett. 2014, 14, 10, 5748-5753. 22 pages.
Giazotto, et al. "Phase-controlled superconducting heat-flux quantum modulator." Appl. Phys. Lett. 101, 102601 (2012).
Nevirkovets, et al. "A superconducting transistorlike device having good input-output isolation." Applied Physics Letters 95, 052505 (2009). 5 pages.
McCaughan, et al. "A superconducting thermal switch with ultrahigh impedance for interfacing superconductors to semiconductors." Nat Electron. 2019; 2(10): 10.1038/s41928-019-0300-8. 14 pages.
Pepe, et al. "Superconducting device with transistorlike roperties including large current amplification." Appl. Phys. Lett. 77, 447 (2000); https://doi.org/10.1063/1.127005. 4 pages.
International Search Report and Written Opinion for International Application No. PCT/EP2021/056076 dated Jun. 16, 2021, 10 pages.

\* cited by examiner

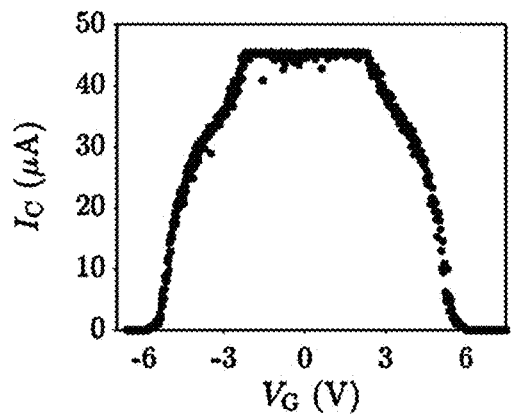
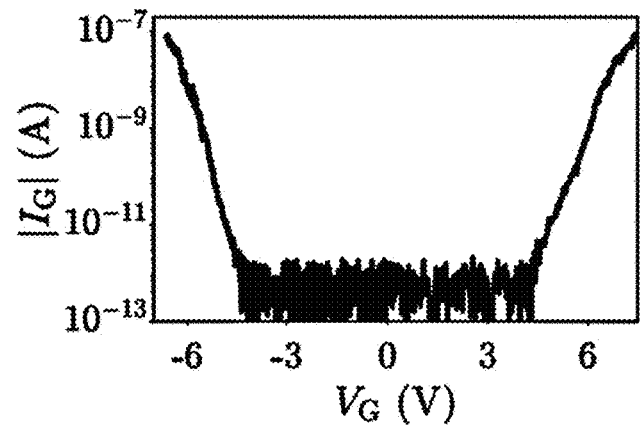
FIG. 1C    FIG. 1D
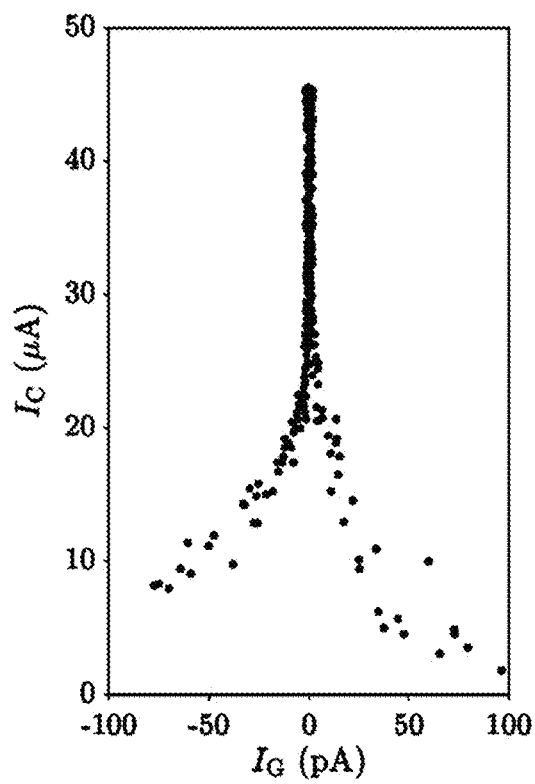
FIG. 1E

OPERATING A SUPERCONDUCTING CHANNEL BY ELECTRON INJECTION

BACKGROUND

The invention relates in general to techniques for operating superconducting channels such as metal wires, e.g., to switch such channels or modulate signals conveyed in the channels. It can notably be used in quantum processing devices, or to adjust a resonant frequency or a cut-off frequency of an electrical circuit that includes such a superconducting channel.

Superconducting circuits, thanks to their low power consumption and high speed, offer great promises as building blocks for quantum computing architectures and related cryogenic control electronics. In this context, it is desired to develop switching devices (e.g., three-terminal devices) that can be electrically tuned between a superconducting and a resistive state at high frequency. Ultimately, such devices would enable novel functionalities for which no semiconducting counterpart exists, such as cryogenic switches, ultrasensitive detectors, amplifiers, circulators, and multiplexers. Several electrically-controlled superconducting switches have been proposed, which are based on the injection of out-of-equilibrium quasiparticles in Josephson junction. However, Josephson junctions typically come with limited source-drain critical currents and the need to operate in magnetic field-free environments. Consequently, architectures that do not rely on Josephson junctions are subject to intense study. Such pioneering approaches are based on three- or four-terminal devices where electrical currents, locally generated Oersted fields, or heat, drive a superconducting channel to a normal state.

Recent advances in quantum computing are making such a technology ever more relevant to industrial applications. Quantum computing makes direct use of quantum-mechanical phenomena, such as superposition and entanglement to perform operations on entangled qubits, i.e., states stored in qubits. For example, superconducting circuits are relatively easy to manufacture with current technologies and are thus promising candidates to further scale quantum information technologies.

The devices used for switching solutions for radio-frequency (RF) applications typically have one or more of the following drawbacks: they have a finite resistance in the ON state that leads to dissipation and/or attenuation of the signal; they have a limited ON/OFF ratio; they are electromechanical in nature and therefore lead to long-term heating and slow switching for cryogenic applications; and/or they are macroscopically large and rather costly.

SUMMARY

According to a first aspect, the present invention is embodied as a method of operating a superconducting channel. The method relies on a device including: a potentially superconducting material; a gate electrode; and an electrically insulating medium. A channel is defined by the potentially superconducting material. The gate electrode positioned adjacent the channel, such that an end surface of the gate electrode faces a portion of the channel. The electrically insulating medium is arranged in such a manner that it electrically insulates the gate electrode from the channel. The device is cooled down such that the channel can become superconducting. Next, a voltage difference is applied between the gate electrode and the channel to inject electrons in the channel through the electrically insulating medium and thereby generate a gate current between the gate electrode and the channel. The electrons are injected with an average energy sufficient to modify a critical current $I_C$ of the channel.

The proposed solution has additional advantages and can be used in multiple applications. For instance, the present scheme allows both the inductance and the resistance of the superconducting channel to be adjusted. Interestingly, the applied voltage difference can be positive or negative. The gate can notably be operated with very low power consumption. Of paramount advantage is the speed at which the critical current $I_C$ of the channel can be adjusted (e.g., in less than 100 ns, down to values close to 1 ps in embodiments). This, in turn, allows very high OFF/ON switching frequencies to be achieved. Thus, the superconducting device can advantageously be operated as a switch to locally suppress superconductivity (e.g., as a switch) and modulate a signal passed through the channel, as in embodiments.

The device can for example be integrated on existing quantum chips. The present approach was shown to satisfactorily work at temperatures equal or lower than 3.4 K when using TiN as a superconducting material. It can notably be applied for signal multiplexing purposes. In other applications, the device is configured as an electrical circuit, such as a LC circuit or any circuit where the superconducting channel is configured as a wire-like inductor. This way, a resonant frequency of the circuit can be tuned by changing the inductance of the wire. Similarly, the resonator can form part of a coupling element a frequency-tunable coupler between qubits of a quantum computer. In further applications, the cut-off frequency of a filter involving a wire-like inductor is adjusted by changing the inductance of the wire. For completeness, the underlying devices are easy to fabricate, can have very small dimensions, and can be fabricated in an integrated fashion In embodiments, applying the voltage difference can lower the critical current $I_C$ to zero and thereby generate an electrical resistance in the channel, at least locally at a level of the portion of the channel. This amounts to locally quenching superconductivity at the level of the portion of the channel, a thing that can advantageously be used for switching applications.

The voltage difference applied can subsequently be switched off for the potentially superconducting material to self-reset to a fully superconducting state, as in embodiments. Thus, the electrical resistance of the channel can be locally increased at the level of the channel portion opposite to the electrode and then reversed, in a controllable manner.

Preferably, the method further comprises applying a signal to the channel, prior to applying the voltage difference. As a result, the electrical resistance generated in the channel impacts a transmission of the signal applied in the channel.

In preferred embodiments, the method further comprises repeatedly applying and switching off the voltage difference, so as to modulate the applied signal. The applied signal can for example be modulated at a frequency that is larger than 10 MHz and smaller than 10 GHz, although any other (lower) frequencies can be used.

The applied voltage difference can be such that an intensity of the gate current generated is at least ten times less than the critical current $I_C$. For example, the intensity of the gate current generated upon applying the voltage difference can for example be between 10 pA and 10 nA.

Preferably, the applied voltage difference can be such that the average energy of the electrons is at least 100 times larger than a superconducting gap of the potentially superconducting material.

In embodiments, the applied voltage difference corresponds to a minimum value required to switch the channel to a normal state thereof. For such a value of the applied voltage difference, an impedance of the gate electrode (as notably determined by the insulating medium) will preferably be larger than 1 GΩ.

Preferably, the method further comprises altering the strength of the voltage difference applied so as to controllably grow a region of the channel in which the electrical resistance is generated. More generally, the method can comprise altering the voltage difference applied, so as to adjust a property of the channel or a property implied by this property of the channel, for example. This way, one can notably adjust a kinetic inductance $L_{kin}$ of the channel. This, in turn, can for example be exploited to adjust a resonant frequency or a cut-off frequency of an electrical circuit of the device, wherein the electrical circuit has an inductor formed by the channel, the latter configured as a wire. In variants, the device is configured as a frequency-tunable coupler connected to quantum circuits of a quantum processing apparatus, and the voltage difference is applied so as to adjust a resonance frequency of the frequency-tunable coupler and thereby modify a coupling between the quantum circuits.

According to another aspect, the invention is embodied as an apparatus. The latter comprises a device as described above in reference to the present method. I.e., the device notably includes a potentially superconducting material, which is structured so as to define a channel (e.g., structured as a wire). The device is adapted to be operated at cryogenic temperatures, so as for the channel to become superconducting, in operation. The device further includes a gate electrode pointing at the channel, so as for an end surface of the gate electrode to face a portion of the channel, and an electrically insulating medium arranged so as to electrically insulate the gate electrode from the channel. The apparatus further comprises a control unit connected to the gate electrode. The control unit is configured to apply a voltage difference between the gate electrode and the channel, so as to inject electrons in the channel through the electrically insulating medium and thereby generate a gate current between the gate electrode and the channel. The control unit and the device in use allow the voltage difference applied to lead to an average energy of the injected electrons that is sufficient to modify a critical current $I_C$ of the channel, in operation of the device (at cryogenic temperatures).

Preferably, the control unit is additionally connected to the channel, and the control unit is further configured to both apply a signal to the channel and alter the signal applied by modifying the critical current $I_C$ of the channel, in operation.

In embodiments, the control unit is further configured to allow a property of the channel, or a property implied by this property of the channel, to be measured, in operation. Meanwhile the control unit allows the applied voltage difference to be controllably modified according to the measured property, so as to adjust said property, in operation.

As described herein, the channel can possibly be structured as a wire. In embodiments, the apparatus further comprises an electrical circuit including an inductor, the latter including, or formed by, the wire. In that case, the control unit can further be configured to adjust a kinetic inductance $L_{kin}$ of the wire, so as to adjust a resonant frequency or a cut-off frequency of the electrical circuit.

Preferably, the device comprises a substrate forming the electrically insulating medium, and each of the gate electrode and the wire is structured on the substrate. For example, a width of the wire is between 40 and 300 nm, and a minimal gap between the end surface of the gate electrode and the portion of the channel is between 40 nm and 300 nm. The width and the minimal gap are measured parallel to a main surface of the substrate.

The present solution can advantageously be used with a variety of superconducting materials. For example, the potentially superconducting material can comprise at least one member selected from the group consisting of: Ti, TiN, Nb, $Ti_xNb_yN_z$, W, WSi, Al, and Mo.

In preferred embodiments, the apparatus is configured as a quantum processing apparatus, which additionally includes quantum circuits, and the channel of the device is connected to one or more of the quantum circuits. The device can notably be configured as: a switch for switching radio frequency signals applied to the channel, as a frequency-tunable coupler for modifying a coupling between two or more of the quantum circuits, or as a frequency-tunable filter to selectively tune the coupling of a quantum circuit (connected to the frequency-tunable filter) to a control circuitry and the environment (e.g., to enhance the coupling from a control line to a readout resonator and reduce the coupling of the same to a qubit of the transmon type).

Methods and apparatuses embodying the present invention will now be described, by way of non-limiting examples, and in reference to the accompanying drawings.

BRIEF DESCRIPTION OF THE DRAWINGS

In the accompanying figures, like reference numerals refer to identical or functionally similar elements throughout the separate views, and which together with the detailed description below are incorporated in and form part of the present specification. FIGS. 1-5 primarily serve to explain various principles of physics underlying embodiments of the invention, while FIGS. 6-11 illustrate various embodiments and advantages of the invention, all in accordance with the present disclosure.

FIGS. 1A-1E illustrate the suppression of the critical current in a metallic nanowire. FIG. 1A is a scanning electron micrograph (with added, artificial contrasts) of a device as involved in embodiments, with overlaid schematics of the measurement setup. The micrograph shows a TiN nanowire and a gate electrode structured on a silicon substrate. FIG. 1B shows the differential resistance $dV/dI_{SD}$ of the nanowire as a function of the source-drain current $I_{SD}$, as measured by sweeping up $I_{SD}$ starting from very negative values. The critical current $I_C$ and the re-trapping current $I_R$ are indicated. The inset illustrates the temperature dependence of $I_C$ (dots) and $I_R$ (squares). FIG. 1C depicts the critical current $I_C$ in the nanowire as a function of the gate voltage $V_G$. FIG. 1D is a curve showing the absolute value of the gate current $I_G$ flowing between the gate and the nanowire as a function of $V_G$. A linear component $I_G \sim 1$ TΩ, attributed to leakage in the measurement setup, was subtracted from the data. FIG. 1E is a parametric plot of $I_C$ vs. $I_G$ obtained from data shown in FIGS. 1C and 1D.

FIG. 2A shows the critical current $I_C$ of the device of FIG. 2A as a function of the gate voltage $V_G$ for various temperatures T. FIG. 2B shows the critical current $I_C$ of the same device as a function of the out-of-plane magnetic field $B_\perp$.

FIGS. 3A and 3B depict the critical current $I_C$ and the gate current $I_G$, respectively, as a function of the gate voltage $V_G$ for a Ti wire structured on a Si substrate. FIGS. 3C and 3D depict the critical current $I_C$ and the gate current $I_G$, respectively, as a function of the gate voltage $V_G$ for a TiN wire on a 25 nm $SiO_2$ film that was thermally grown on a Si substrate.

FIG. 4A is a scanning electron micrograph (e.g., with artificially added contrasts) of a variant to the device of FIG. 1A, as used in embodiments, with an overlaid schematics of the measurement setup. FIG. 4B shows the differential resistances $dV_i/dI_{SD}$, i=1, 2, 3, close to the complete suppression the superconducting state. The re-trapping current $I_R$ is indicated by a dotted line. FIG. 4C depicts critical currents $I_{SWi}$, i=1, 2, 3, 4, 5, as a function of the gate voltage $V_{G1}$. FIG. 4D is a plot of the absolute value of the gate current $I_{G1}$ as a function of the gate voltage $V_{G1}$.

FIG. 5A shows the time-dependent switching characteristics of the device of FIG. 1A as a function of the DC gate voltage bias $V_G$. A square wave of peak-to-peak amplitude 0.5 V and 100 kHz repetition rate is added to $V_G$. FIG. 5B depicts the gate current $I_G$ as a function of $V_G$ measured simultaneously with the data in FIG. 5A. FIG. 5C is a line-cut of the data in FIG. 5A for $V_G$=4.5 V (corresponding to the black marker shown on the right-hand side of FIG. 5A and on the bottom of FIG. 5B). FIG. 5D is a zoom-in of the data in FIG. 5C in proximity of a rise transition. Dashed vertical lines indicate the 10% to 90% amplitude transition, corresponding to a rise time of 90 ns.

FIG. 6A is a simplified, schematic representation of a superconducting device, which forms part of the apparatus. FIG. 6B shows a more realistic representation of the superconducting device (top view), with overlaid schematics corresponding to electronic components involved in the apparatus. The device shown in FIG. 6B is equivalent to that of FIG. 1A. FIG. 6C is a zoomed-in, rotated version of the device shown in FIG. 6B. The diagram shown in FIG. 6D illustrates the electron injection mechanism; FIG. 6D must be read together with FIG. 6C. FIG. 6E shows the general architecture of a quantum processing apparatus according to embodiment, wherein the superconducting device is used as a frequency-tunable coupler connected to qubits, on the qubit platform.

FIG. 7 is a simplified representation of another superconducting device including a coplanar waveguide resonator, wherein a gate electrode is used to tune the resonance frequency of the resonator, as in embodiments.

FIG. 8 is a simplified representation of a further superconducting device, which includes a Pi section filter with an inductor, and a gate electrode that is used to adjust the resonant frequency of the circuit, as in embodiments.

FIGS. 9-11 are flowcharts illustrating high-level steps of methods of operating a superconducting channel, according to embodiments. FIG. 9 shows basic steps of the methods.

FIGS. 10 and 11 show steps performed to modulate a signal passed through the channel and to adjust a property of the superconducting channel (or another property of the device that is determined by a property of the superconducting channel), respectively.

Figure 1A:
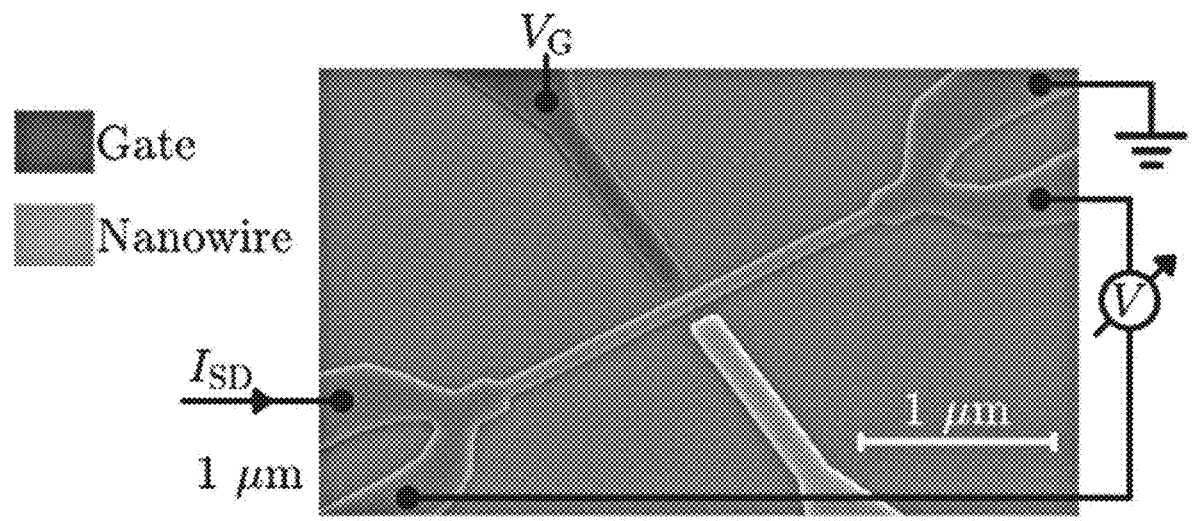

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

Metallic devices capable of switching between a resistive and a superconducting state with the application of a control signal have been actively developed for more than sixty years. Existing superconducting switches are however bulky or require large source-drain bias currents and gate currents for operation, making them impractical for many applications and difficult to interface with classical semiconducting electronics.

For instance, devices such as mentioned in the background section, whether based on Josephson junctions or alternative designs, are typically characterized by low-gate impedances, so that large gate currents are needed for operation and substantial power is drawn from the driving circuit. Furthermore, such devices typically operate with large source-drain bias currents, which inhibit self-resetting from normal to superconducting state due to Joule heating. Switching the channel back to a superconducting state then requires additional circuitry to periodically drive the source-drain current below the re-trapping current, where a transition to the superconducting state occurs. When full suppression of the source-drain critical current is achieved, operation at low current bias is enabled and self-resetting (from the normal state to the superconducting state) becomes possible, as recently shown for an electrothermal device.

The present invention relies on electrically controlled devices based on a superconducting channel (e.g., a metallic nanowire). Such devices can for example be used as switches, or related devices, wherein the normal state of the channel is obtained by injection of high-energy electrons from a gate contact through an insulating barrier. Typically, the operative gate currents are several orders of magnitude smaller than the nanowire critical source-drain current, effectively resulting in a voltage-controlled device. The switching mechanism is very fast. In embodiments, the channel can self-reset from its normal state to its superconducting state and is capable of operating in very large magnetic fields. Such devices can advantageously be used in low-power cryogenic applications and, in particular, in quantum computing applications.

Figure 9:
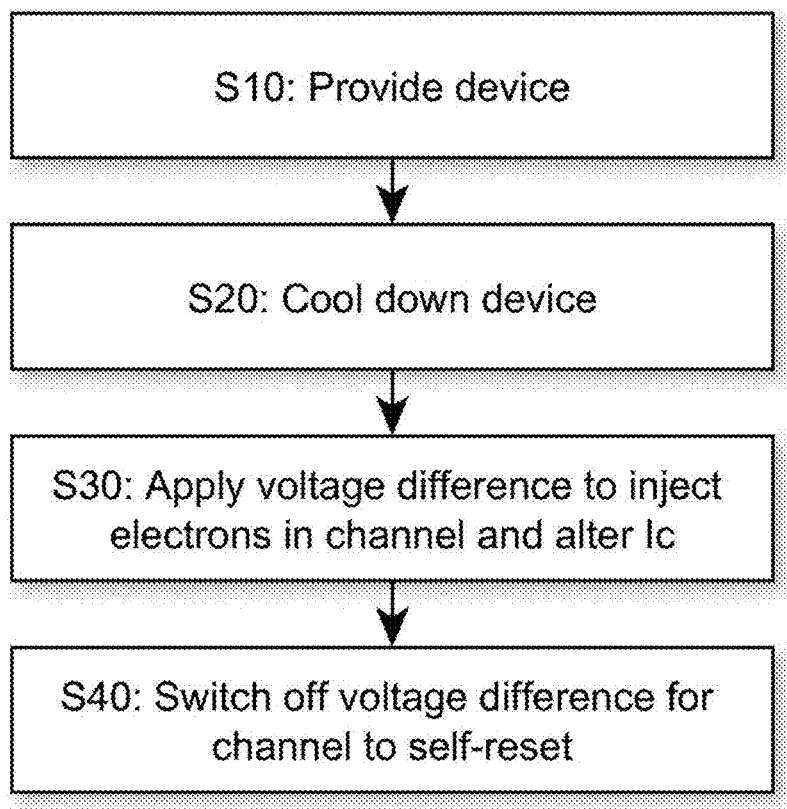
Figure 10:
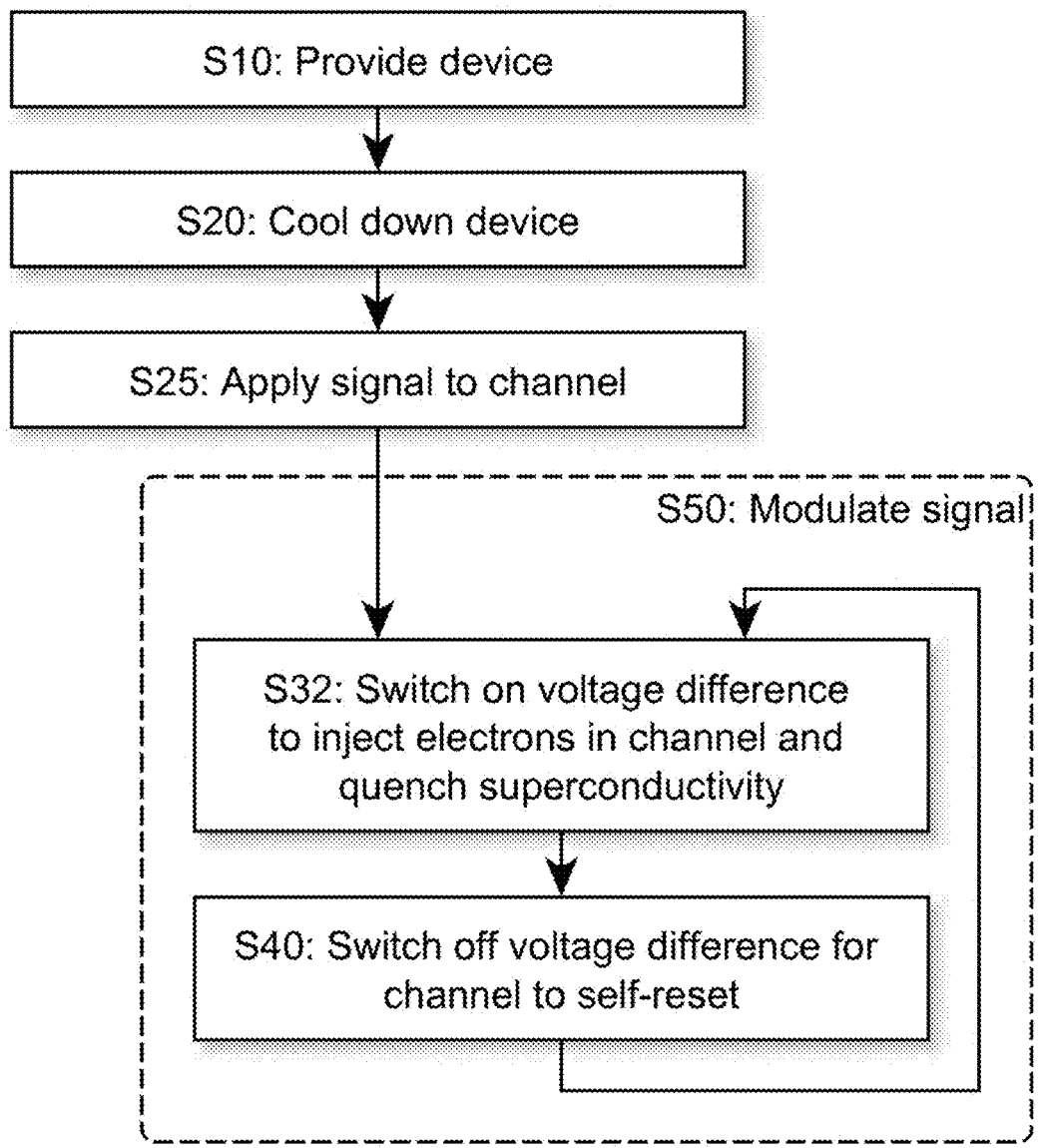
Figure 11:
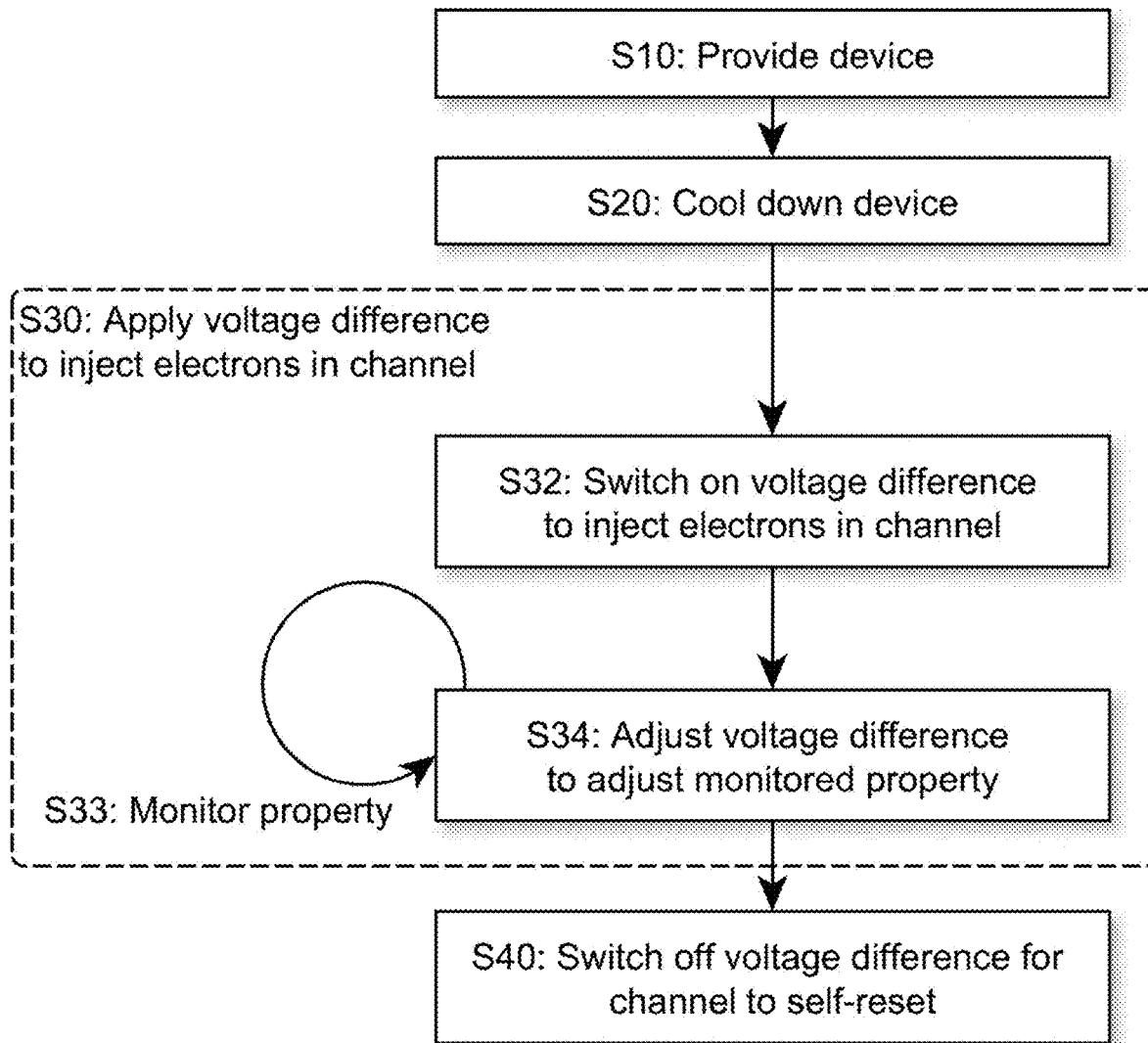

The following description is structured as follows. First, general embodiments and high-level variants are described (sect. 1). The next section addresses more specific embodiments and explores the physics underlying the invention (sect. 2). The present method and its variants are collectively referred to as "the present methods". All references $S_{ij}$ refer to methods steps as shown in the flowchart of FIGS. 9-11, while numeral references pertain to physical parts or components of apparatuses.

1. General Embodiments and High-Level Variants

In reference to FIGS. 6-11, an aspect of the invention is first described, which concerns a method of operating a superconducting channel 102, 112, 122. The method relies S10 on a superconducting device 10, 11, 12. The device is designed to be operated at cryogenic temperatures. This device can notably be embodied as a structured, multilayer device 10 (as in FIGS. 6A-6C), a coplanar waveguide resonator (FIG. 7), or an electric circuit involving an inductor (as in FIG. 8).

Figure 7:
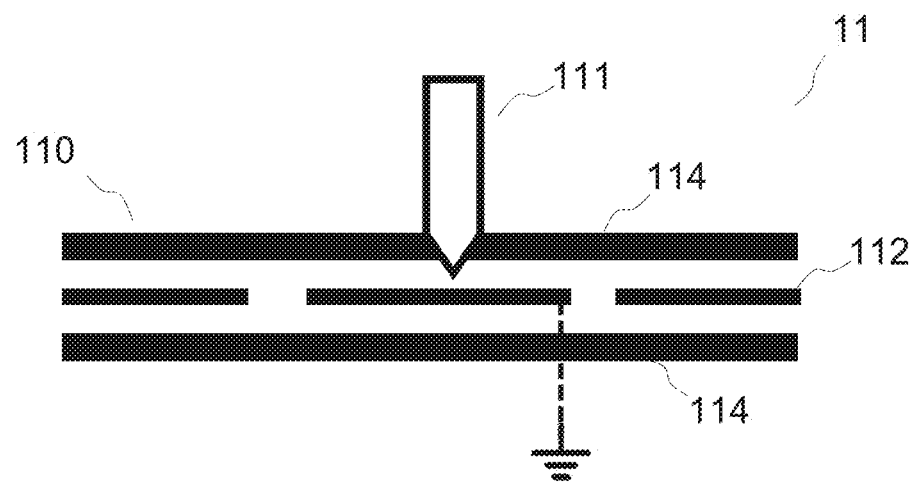
Figure 8:
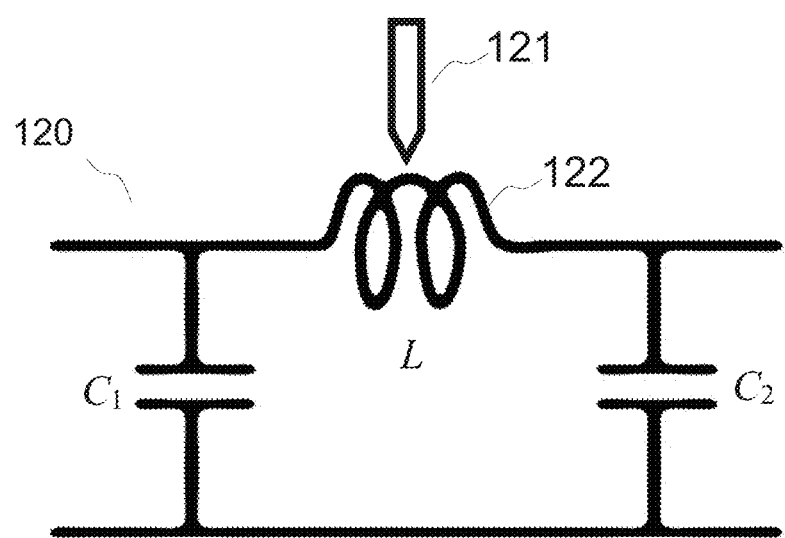

In all cases, the device includes a potentially superconducting material, which is structured so as to define a channel 102, 112, 122, e.g., in the form of a wire. The device further includes a gate electrode 101, 111, 121. The gate electrode points at the channel 102, 112, 122, whereby an end surface of the gate electrode faces a lateral portion of the channel. The gate electrode typically extends perpendicularly to the channel, as seen in FIGS. 6-8. In addition, an electrically insulating medium 103 is provided, which electrically insulates the gate electrode 101, 111, 121 from the channel 102, 112, 122.

The electrically insulating medium 103 can notably comprise a portion extending between the end surface of the gate electrode 101, 111, 121 and the opposite portion of the channel 102, 112, 122. That is, the electrically insulating medium can physically connect the gate electrode to the channel in that case (i.e., it serves as a mechanical, yet electrically insulating), as assumed in FIGS. 6B and 6C. The insulating medium 103 can notably be provided as a substrate layer 103 supporting the superconducting material 102 and the gate electrode 101 (see FIGS. 6B and 6C). In variants, the insulating medium can be an intermediate layer extending between the channel layer and the gate layer, for example. In other variants, the electrically insulating medium can also be structured so as to define vacuum (or air) portions, contributing to insulate the gate electrode from the channel. More generally, the electrically insulating medium can include any element to electrically insulate the gate electrode from the channel.

The device 10, 11, 12 needs to be cooled down S20, so as for the channel 102, 112, 122 to become superconducting. Next, a voltage difference is applied S30, S32 between the gate electrode 101, 111, 121 and the channel 102, 112, 122, so as to inject electrons in the channel through the electrically insulating medium 103. This results in generating a net (albeit small) gate current between the gate electrode and the channel, which is accordingly grounded. Moreover, electrons are injected with an average energy that is sufficient to modify a critical current $I_C$ of the channel.

Injected electrons overcome the tunnel barrier made up by the insulating medium 103 by tunnel effect or by field emission (which involves tunnelling too). Note, the operation of the superconducting devices 10, 11, 12 differs from the operation of a mere Josephson junction as a Josephson junction is usually operated at zero voltage difference, so that a supercurrent can flow with zero voltage drop. There are situations where a voltage difference can be applied to a Josephson junction. However, this voltage is typically on the order of the superconducting gap, whereas the voltage applied here is much larger.

In the present context, the current flow generated upon applying the voltage difference gives rise to a measurable leakage current between the gate electrode 101, 111, 121 and the channel 102, 112, 122. The intensity of the generated current depends on the applied voltage difference, typically in an exponential manner. So, the operation of the device differs from a mere application of an electric field to the channel.

Measurements performed by the inventors indicate that relatively few electrons, injected at energies that are typically much higher than the superconducting gap, suffice to trigger the generation of a large amount of quasiparticles, which impacts the critical current density of the superconducting material. The critical current density is at least locally altered, at the level of the portion of the channel that is opposite to the gate electrode. This, in turn, impacts the critical current $I_C$ of the channel. The critical current $I_C$ characterizes the maximum current that can be passed in the channel 102, 112, 122 without suppressing superconductivity. To summarize, injecting high-energy electrons locally alters the quasiparticle density, which impacts the critical current density of the superconducting material (at least locally) and, in turn, alters the critical current of the channel.

The critical current $I_C$ can possibly be lowered to zero to create a non-zero resistance in the channel, as in embodiments discussed below. If the critical current density is locally lowered to zero, then the extent of the normal region (i.e., non-superconducting region) that is produced impacts the overall resistance of the channel. This phenomenon can notably be leveraged to locally quench superconductivity and, e.g., modulate an electromagnetic signal passed through the channel 102, 112, 122, as in embodiments discussed below. Now, increasing the quasiparticle density not only affects the critical current but can also impact other properties such as the kinetic inductance of the channel, thanks to a non-trivial mechanism that is explained later in detail. And this additional phenomenon can be exploited to adjust any property of the system on a macroscopic scale, as implied by the altered state of the channel. For example, this phenomenon can be exploited to adjust a resonant frequency or a cut-off frequency of an electrical circuit that includes the channel (e.g., configured as a wire-like inductor in a LC circuit), or to adjust a resonance frequency of a tunable coupler for coupling quantum qubits, as in embodiments discussed later.

The physical phenomena underlying the present invention was shown to occur for various kinds of device structures and various superconducting materials. Note, in that respect, that superconducting channels are usually made of aluminum (Al), which becomes normal at very small magnetic fields. By contrast, a variety of superconducting materials can be used to fabricate the devices involved in the present methods, including materials such as titanium nitride (TiN), which allow superconductivity to be maintained for much larger magnetic fields than Al. As a result, the devices involved in the present methods can be operated in very large magnetic fields.

The proposed solution has additional advantages and can be used in multiple applications. For instance, locally adjusting the critical current density of the superconducting material allows both the inductance and the resistance of the superconducting channel to be adjusted. Interestingly, the applied voltage difference can be positive or negative. The channel can notably be operated with DC voltages at very low power (e.g., less than 1 nW in the OFF state and 0 W in the ON state). Of paramount advantage is the speed at which the critical current $I_C$ of the channel can be adjusted (e.g., in less than 100 ns, down to values close to 1 ps in embodiments). This, in turn, allows very high OFF/ON switching frequencies (e.g., up to 10 GHz) to be achieved. Thus, the superconducting device can advantageously be operated as a switch to locally suppress superconductivity (e.g., as a switch) and modulate a signal passed through the channel, as in embodiments.

The device can for example be integrated on existing quantum chips (e.g., on the same platform as the amplifier or even on the qubit chips). The present approach was shown to satisfactorily work at temperatures below 3.4 K when using TiN as a superconducting material. It can notably be applied for signal multiplexing purposes, e.g., for switching signal routing on or near the quantum chip. In other applications as evoked above, the device is configured as an electrical circuit, such as a LC circuit or any circuit where the superconducting channel is configured as a wire-like inductor. This way, a resonant frequency of an LC oscillator or any other oscillator involving a wire-like inductor can be tuned by changing the inductance of the wire. Similarly, the resonator can form part of a coupling element of a frequency-tunable coupler between qubits of a quantum computer, whereby tuning the resonator frequency makes it possible to tune the qubit coupling. In further applications, the cut-off frequency of an LC filter, a Pi filter, or any other filter involving a wire-like inductor, is adjusted by changing the inductance of the wire. For completeness, the underlying device 10, 11, 12 is easy to fabricate, can have very small dimensions, and can be fabricated in an integrated fashion. This makes it an ideal component for cryogenic applications. Beyond quantum processing and frequency-tuning applications, additional applications can be contemplated (e.g., directed to detectors, amplifiers, circulators, and multiplexers).

All this is now described in detail, in reference to particular embodiments of the invention. To start with, referring to FIGS. 9-10, the voltage difference can be applied S30, S32 so as to lower the critical current $I_C$ of the channel to zero and thereby generate an electrical resistance in the channel 102, 112, 122. This resistance is at least locally generated, at the level of the portion of the channel that is opposite to the gate electrode. In other words, this amounts to locally quenching superconductivity at the level of the portion of the channel 102, 112, 122, a thing that can advantageously be used for switching applications.

As further seen in FIGS. 9-10, the voltage difference shall typically be switched off S40 at some point, such that the superconducting material 102, 112, 122 self-resets to its fully superconducting state, it being noted that the channel is maintained at an adequate temperature therefor, after having cooled it down at step S20. Thus, the electrical resistance of the channel 102, 112, 122 can be locally increased (e.g., turned to its normal state) at the level of the channel portion opposite to the electrode and then reversed, in a controllable manner. The process is thus reversible, despite a hysteresis that likely occurs. The dimensions of the region turned to normal can be controlled via the applied voltage, as discussed later.

The scheme of FIG. 9 can notably be used to switch or even modulate a signal routed via the channel, as now discussed in reference to FIGS. 6 and 10. That is, a signal can be applied S25 to the channel 102, e.g., to route this signal through the channel, prior to applying S32 the voltage difference to inject electrons in the channel. As explained above, this causes to generate an electrical resistance in the channel 102, which, in turn, impacts S50 the transmission of the signal applied S25 in the channel. Note, the applied signal can be an AC or a DC signal. It can for example be an RF signal, as in quantum computing applications discussed later. Thus, the present methods can notably be used to switch or modulate a signal, possibly at very high frequency, a thing that can advantageously be exploited in applications to quantum processing. In such application, the signals applied are normally RF signals, a source impedance of which is typically between 10 and 100Ω (e.g., 50 ohms), which can rapidly and easily be switched according to the present methods.

In particular, steps S32 and S40 can be repeatedly performed, so as to repeatedly apply S32 and switch off S40 a voltage difference, in view of modulating S50 the signal applied S25 to the channel 102. As described herein, the term "modulating" a signal should be understood in a broad sense referring to a process of varying one or more properties of the signal (e.g., typically a waveform). One can notably vary the intensity of the signal passed through the channel (e.g., by controlling the size of the high-resistance region) and/or the frequency at which the signal is transmitted (by repeatedly switching OFF and ON the channel. Still, the signal applied at step S25 can already be a modulated signal, e.g., a waveform of varying amplitude or frequency, for example. Several applications can be contemplated. For example, one can switch a medium wave (MW) signal and route it to different ports, for multiplexing purpose.

Quantitatively, a property of the applied signal can for example be modulated S50 at a frequency that is larger than 10 MHz and smaller than 10 GHz, which opens the door to several applications at cryogenic temperatures. Again, such frequencies denote ON/OFF switching frequencies, which should be distinguished from the usual frequency modulation process. Measurements performed by the inventors have confirmed that single operation times less than 100 ns can be achieved. However, taking into account limitations of the measurement set-up they used led them to conclude that the duration of a single operation can be on the order of a picosecond. Two effects are involved, which are the relaxation and the diffusion of quasiparticles away from the injection point. The effects of quasiparticle relaxation and diffusion have already been shown to be very fast processes for comparable device structures (e.g., on the order of 20 to 50 ps, or less, it being noted that the diffusion process is probably much faster than the relaxation process) where the quasiparticle generation process is thermally triggered by applying a heat pulse. In the present case, however, the quasiparticles generated are not in thermal equilibrium, such that the above estimations (e.g., 20 to 50 ps) can be regarded as an upper bound to the actual time duration of the process, which will also depend on the superconducting material used.

It remains that, in the present case, modulation frequencies of up to 10 GHz can be contemplated, in principle. Still, other embodiments can require lower frequencies (e.g., on the order of, or even less than, 1 KHz, 1 MHz, or 10 MHz).

Another outstanding feature of the present methods is that the intensity of the gate current, generated upon applying S30, S32 the voltage difference, remains far below the critical current $I_C$ of the channel (e.g., at least ten times less than $I_C$). Thus, the gate current does not jeopardize the state of the channel, hence making the process well controllable. In practice, however, the gate current can be several orders of magnitude smaller than the critical source-drain current. This point is discussed in detail in sect. 2.1. Depending on the superconductor material chosen, a total suppression of superconductivity can typically be achieved using gate currents between tens of pA to a few nA. That is, the intensity of the gate current generated at step S30, S32 is typically between 10 pA and 10 nA. This is in stark contrast to previously demonstrated devices, where gate currents comparable to the critical current $I_C$ (e.g., a few μA) were required to operate the devices.

Relatively few electrons are injected at energies that are typically much higher than the superconducting gap to trigger the generation of quasiparticles. The voltage difference can for instance be applied S30, S32 so as for this average energy to be at least 100 times larger than the superconducting gap of the superconducting material, see FIG. 6B for an illustration. The superconducting gap is defined as the energy difference between the ground state of the superconductor channel 102 and the energy of the lowest quasiparticle. In fact, the average energy of injected electrons will typically need to be between 50 and 60 000 times larger than the gap, although even larger ratios can be observed, in principle. Preferred ratios are in the range of 5000 to 20000, in particular for Ti-based materials. This ratio can for instance be of approximately 10 000. That is, for a gap of 2 $\Delta$=500 µeV, a voltage difference of approximately 5 eV can be applied, as assumed in FIG. 6D.

Note, the preferred ratios depend on the desired mode of operation. For switching applications, very large ratios (e.g., with small voltage differences) yield satisfactory results. Superconductors with a small gap, like titanium, would be preferred for such applications. However, where a pronounced suppression of the signal transmission in the OFF state of the channel is desired, superconductors such as TiN, having a high resistance (in their normal state), will be preferred. Superconductor materials with a high normal state resistance would also be preferred for frequency-tuning applications as they have a high kinetic inductance.

The impedance of the gate electrode, which is primarily determined by the insulating medium 103, can typically be larger than 1 G$\Omega$. Such a value corresponds to the minimum value of voltage difference that is required to locally switch the channel to its normal state. However, the gate impedance will likely be substantially larger in practice. For instance, in examples discussed in sect. 2.1, superconductivity can be quenched at about 5V/1 nA=5 G$\Omega$. The gate impedance will likely be larger than 1 T$\Omega$ when the critical current density starts being affected by the applied voltage difference. On the other hand, it can be less than 1 G$\Omega$ when the applied voltage is a bit larger and the normal region in the channel starts to expand. This is a consequence of the exponential behavior of the switch: the tunneling junction makes the resistance $V_G/I_G$ vary in an exponential manner.

In that respect, the strength of the voltage difference applied can possibly be altered S34, so as to controllably grow the region of the channel 102 in which the electrical resistance is generated, as reflected in the flowchart of FIG. 11. If necessary, the voltage difference can be adjusted so as to maintain the source drain current $I_{SD}$ above the re-trapping current of the superconducting material. The large OFF resistance can be reached by extending the normal region via a source-drain current $I_{SD}$ that is larger than the re-trapping current, this resulting in a runaway heating effect. In this way, as soon as a local, normal region is created, all the wire turns normal due to runaway heating.

More generally, the strength of the voltage difference can be altered S34 so as to adjust any local property of the channel, or any property (e.g., of the apparatus, or a connected component) that is determined by this local property. To that aim, one can possibly monitor S33 the target property. For instance, and as explained earlier, altering the critical current density (e.g., a local property) impacts the overall critical current (a non-local property) of the channel. As we shall see, this can further impact the kinetic inductance $L_{kin}$ (another non-local property) of the channel, a thing that can be leveraged to tune additional properties, such as the resonant frequency or the cut-off frequency of an electrical circuit that includes the superconducting channel.

The voltage difference applied can indeed be modified to alter S34 the kinetic inductance $L_{kin}$ of the channel 102, 112, 122, for the following reasons. Electrons are injected in the channel, which creates a finite quasiparticle density that drops to zero away from the electron injection point. In regions of higher quasiparticle density, both the critical current density and the kinetic inductance $L_{kin}$ are altered. That the reduction of $I_C$ leads to an increase in $L_{kin}$ is thus an accidental result of increasing the quasiparticle density, upon injecting electrons.

As described herein, the kinetic inductance $L_{kin}$ can be altered S34 so as to adjust a frequency of an electrical circuit 120 that includes the superconducting channel 122, where the latter is configured as a wire forming an inductor 122 in the circuit. That is, the critical current $I_C$ is altered by injecting electrons, which happens to increase the kinetic inductance $L_{kin}$ of the channel 122, as explained above. Now, this phenomenon can thus be used to adjust a frequency of the electrical circuit. For example, this frequency can be the resonant frequency of an LC oscillator or any other oscillator involving a wire-like inductor 122. The resonant frequency is modulated by changing the inductance of the wire. In other applications, the cut-off frequency of an LC filter, e.g., a Pi filter as assumed in FIG. 8, or any other filter involving a wire-like inductor, is adjusted by changing the inductance of the wire, thanks to the gate electrode 121. FIG. 8 actually shows a Pi section filter 120 involving two capacitors $C_1$, $C_2$ and an inductor L (e.g., the wire 122), as part of a device 12, which otherwise involves an electrode 121 that is separated from the wire 122 by an insulating medium (not shown).

Other applications can for instance aim at tuning the resonance frequency of a coplanar waveguide (CPW) resonator 110, as assumed in FIG. 7, or a frequency-tunable coupler. In the example of FIG. 7, the device 11 includes a CPW resonator 110, which comprises a conducting track 112 and a pair of return conductors 114 on either side of the track 112. The return conductors are separated from the conducting track by respective gaps. A gate electrode 111 points at the track 112. Again, the device is voltage-controlled, via the gate electrode 111. The small electron current generated needs to outflow; the central conductor 112 of the CPW resonator is thus connected to ground, a thing that can be achieved with a very thin, high-kinetic inductance wire, for example.

In other applications, the superconducting device can be used as a frequency-tunable coupler for coupling quantum circuits (e.g., superconducting qubits). For instance, FIG. 6E depicts a classic architecture of a quantum processing apparatus. The quantum circuits 55 are assumed to be superconducting qubits of the transmon type in that case, though spin-based and topological qubits can potentially benefit from the present invention too. The apparatus 1 otherwise includes multiple RF-controlled components, such as couplers and frequency-tunable coupling elements. The apparatus 1 is discussed below in detail, in reference to another aspect of the invention.

Referring to FIGS. 6-8, another aspect of the invention is now described, which concerns an apparatus 1. This apparatus can notably be a quantum processing apparatus, or any apparatus including parts operated at cryogenic temperature. Aspects of this apparatus have already been discussed in reference to the present methods; they are only briefly described in the following.

The apparatus basically comprises a device 10, 11, 12, which includes a potentially superconducting material. As explained earlier, the latter is structured so as to define a channel 102, 112, 122, which is preferably structured as a wire. The device is adapted to be operated at cryogenic temperatures, so as for the channel 102, 112, 122 to become superconducting. The device further includes a gate electrode 101, 111, 121 pointing at the channel 102, 112, 122, so as for an end surface of the gate electrode to face a portion of the channel. In addition, an electrically insulating medium 103 is arranged so as to electrically insulate the gate electrode 101, 111, 121 from the channel 102, 112, 122, as discussed earlier.

Figure 6A:
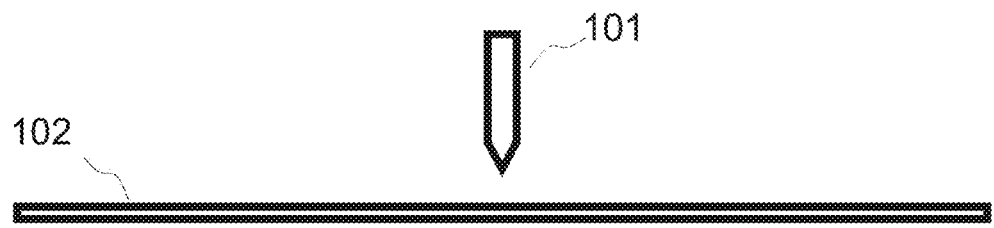
FIGS. 6A-6E relate to an apparatus according to embodiments.
Figure 6B:
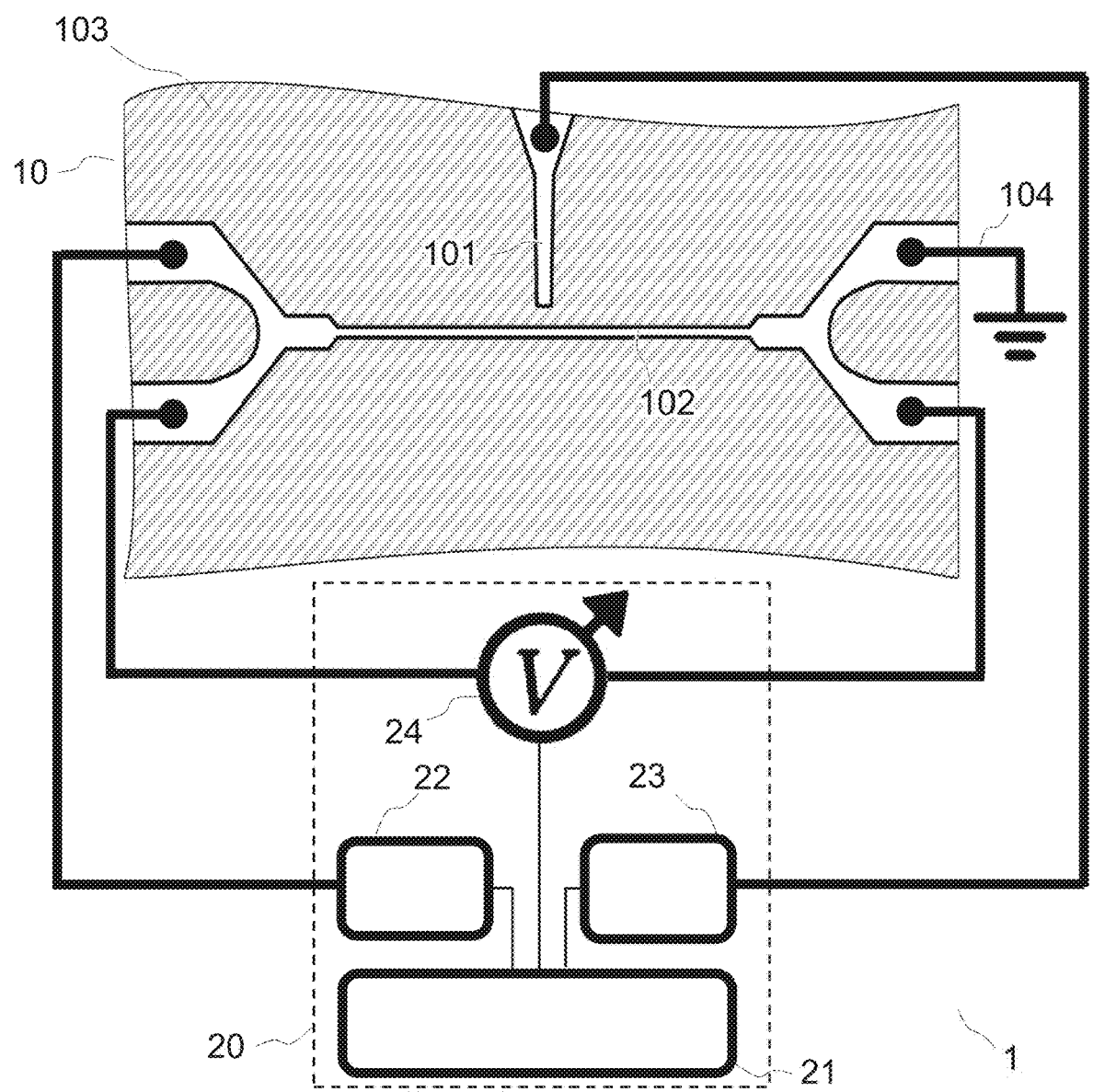
Figure 6C:
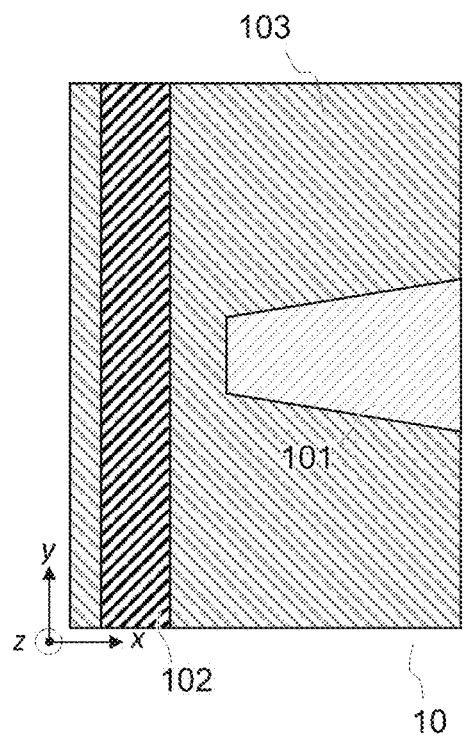
Figure 6D:
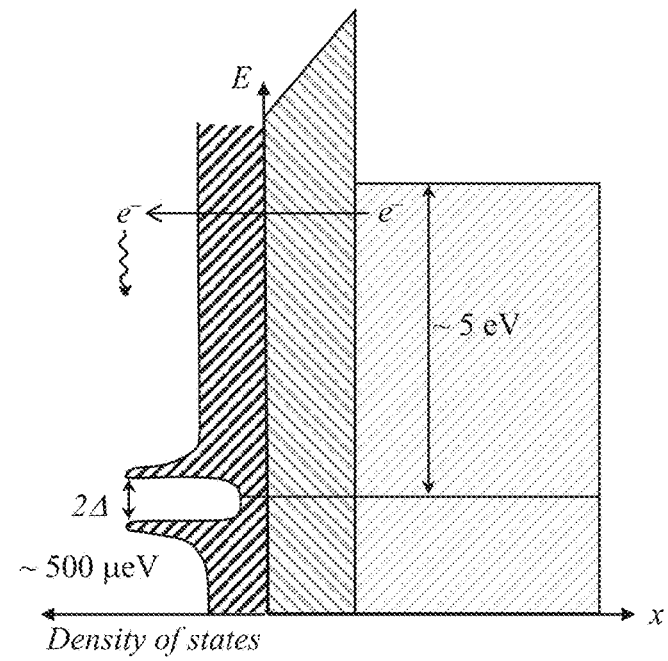
Figure 6E:
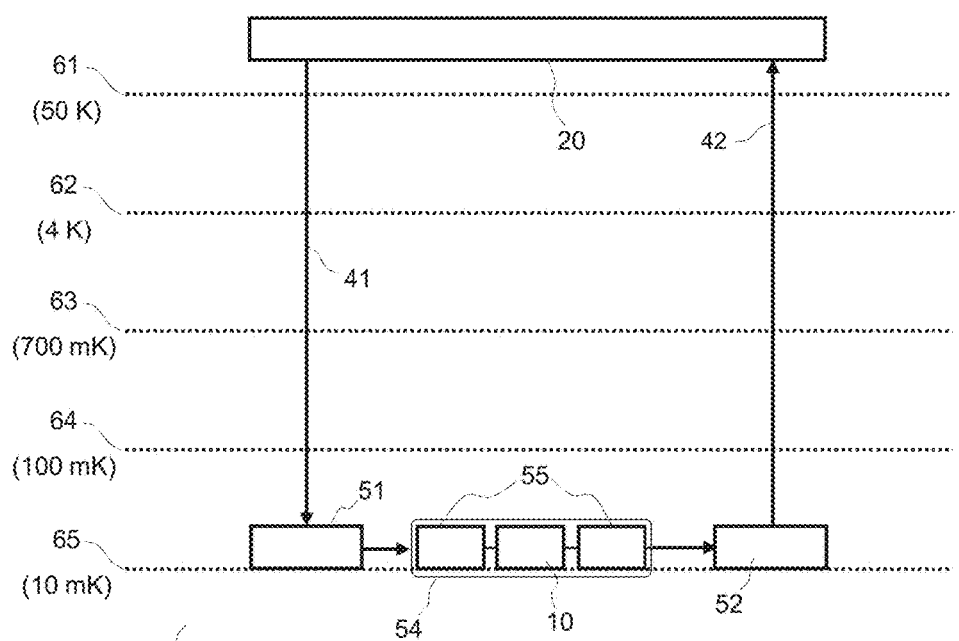

As further seen in FIGS. 6B and 6E, the apparatus 1 additionally comprises a control unit 20. The latter is connected to the device 10, and in particular to the gate electrode 101. The control unit 20 can for instance consist of various interconnected elements 21-24, as assumed in FIG. 6B. It is generally configured to apply a voltage difference between the gate electrode 101 and the channel 102, so as to inject electrons in the channel through the electrically insulating medium 103 and thereby generate a gate current between the gate electrode 101 and the channel 102. The control unit, together with the device 10, makes it possible to inject electrons with an average energy that is sufficient to modify the critical current $I_C$ of the channel, in operation of the device, owing to principles discussed earlier.

As further seen in FIG. 6B, the control unit 20 can additionally be connected to the channel 102. Furthermore, the unit 20 can be configured to both apply a signal to the channel 102 and alter the signal applied by modifying the critical current $I_C$ of the channel 102, in operation. This enables applications such as discussed earlier in reference to FIG. 11. In particular, the control unit 20 can be configured to allow a property of the channel 102 (e.g., or any property implied by this property of the channel) to be measured. The unit 20 can further be designed to allow the applied voltage difference to be controllably modified according to the measured property, so as to adjust the property, in operation. To that aim, the control unit can include additional equipment to monitor the property to be adjusted, as further discussed in sect. 2.1.

In the example of FIG. 6B, the unit 20 comprises a source-measure unit 23 that can both: force a desired voltage, and measure current entering the gate. Further, the unit 20 can comprise a voltmeter connected to the channel 102. A signal generator 22 is connected to the channel 102, which is itself connected to ground 104. The various component are controlled with a logic unit 21, which can possibly communicate with an external computer (not shown) and be operated from a cloud, if necessary.

As further seen in FIGS. 6B and 6C, the device 10 comprises a substrate 103, which serves as electrically insulating medium 103. Each of the gate electrode 102 and the wire 102 is deposited and structured on the substrate 103. The gate electrode 101 and the channel 102 are, each, preferably made of a same material to ease lithographic steps (e.g., a single lithographic step is needed to fabricate the device 10, as explained in sect. 2.2). Each of the superconducting material 102 and the gate material 101 can for instance comprise Ti, TiN, Nb, $Ti_xNb_yN_z$, W, WSi, Al, Mo, a combination thereof, and/or the like. The substrate 103 can for example include Si, $SiO_2$, Sapphire, $Si_3N_4$, $HfO_2$, a combination thereof, and/or the like. It will be apparent to the skilled person that other materials can be contemplated. In addition, other structure designs can be used for the device 10. In particular, the insulating medium can be provided as an intermediate layer, or as a void separating the gate 101 from the channel 102.

The width of the wire 102 is typically between 40 and 300 nm, while the minimal gap between the end surface of the gate electrode 101 and the opposite portion of the channel 102 is preferably between 40 nm and 300 nm. The width of the wire 102 and the minimal gap are measured parallel to the main surface of the substrate 103, along the direction x in FIG. 6C (e.g., transversely, in-plane, to the direction y of longitudinal extension of the wire in this example). Note, however, that the width of the channel and the minimal gap can possibly be smaller than 40 nm (e.g., equal to 10 nm).

FIG. 6D is a corresponding diagram, schematically showing the density of states in the channel 102 and illustrating the electron injection process and the quasiparticle generation process. Electrons are injected with an average energy of 5 eV in this example. Electrons cross the insulating medium by tunnel effect. The high energy of the injected electrons (e.g., much larger than the superconducting gap, 5 µeV in this example) cause to form quasiparticles in the channel 102, as explained earlier.

FIG. 6E shows the general architecture of a quantum processing apparatus 1 according to embodiments. Such an apparatus 1 generally includes one or more devices 10, as well as quantum circuits 55, here assumed to be superconducting qubits of the transmon type. The superconducting channel of each device 10 is coupled to one or more of the quantum circuits 55. The coupling is preferably achieved via a capacitance, although an inductive coupling can be contemplated too.

In detail, the apparatus 1 shown in FIG. 6E comprises several cooling stages 61-65. It notably includes a first stage 61, which comprises or is connected to a control unit 20. The stage 61 can include one or more signal generators (not shown), to generate RF signals as needed to drive the components 10, 55. Such signal generators can form part of the control unit 20; they are at least connected to it. Signals are generated and sent to the qubit platform, along the downward path 41, processed at the level of the qubit platform, as necessary to perform quantum computations, and output signals are sent back along the upward path 42 to the control unit 20. The apparatus further comprises a second stage 65 adapted to be cooled down at a much lower temperature than the first stage. The superconducting qubits 55 and the devices 10 are arranged in the second stage 65, which likely comprises a variety of other components 51, 52, such as attenuators, circulators, isolators etc., as known per se. The apparatus 1 further includes intermediate stages 62-64 between the first stage 61 and the second stage 65. Thus, the first stage, the intermediate stages 62-64, and the second stage 65 form a series (i.e., a chain) of successive stages, wherein each intermediate stage is adapted to be cooled down at a lower temperature than any previous stage of the series. Each stage 61-65 can comprise a variety of electronic components (e.g., attenuators for thermalizing RF signals from the signal generators, communication means (e.g., optical and/or electrical), cooling means, etc. Such electronic components are known per se and not shown in FIG. 6E, for conciseness. The apparatus can comprise additional stages, including a room-temperature stage (not shown). The (indicative) temperatures displayed in FIG. 6E indicate possible temperatures as achieved by the various platforms, in operation. Of course, other platform temperatures can be used. For example, the upper platform 61 can be a room-temperature platform.

In the example of FIG. 6E, each device 10 is configured as a frequency-tunable coupler. Each coupler 10 is connected to two or more qubits 55 for modifying a coupling between such qubits 55, in operation. Note, the qubits 55 are computational qubits, which, together with a connected coupler 10, form a structure 54 of coupled qubits. Each structure 54 includes N computational qubits (e.g., fixed-frequency transmons), where N≥2, and at least one coupling element 10 coupling pairs of the N qubits. The apparatus 1 shown in FIG. 6E comprises superconducting channels (not shown) leading to the qubits 55 and the coupling elements 10, as well as electrical connections (not shown), as necessary to operatively couple the control unit 20 to each structure 54 of coupled qubits. Each coupler 10 is operated as follows. A voltage difference is forced, from the unit 20, to be applied to the gate 101 of a coupler 10, so as to adjust the resonance frequency of the frequency-tunable coupler 10 and thereby modify a coupling between the quantum circuits 55, as explained earlier.

FIG. 6E provides a very schematic depiction. Of course, several arrangements of qubits 55 and couplers 10 can be contemplated. The qubits 55 can possibly be connected to one or more tunable couplers 10, e.g., to allow transitions between states of the qubits to be parametrically driven, by modulating the tunable coupler energy. Besides the parametric driving of the qubits, one can also use a quantum gate where the coupler or the tunable bus is brought into resonance with two qubits, so as to swap excitations between the qubits. Another option is to use a fixed bus, whose frequency is changed so as to turn off interactions completely. More generally, by tuning the frequency of the coupler 10, one can enable or disable multi-qubit interactions.

The unit 20 can for instance comprise or be connected to a compiler and a sequencer (not shown), which are usual components of quantum processing apparatuses. The compiler determines and schedules high-level operations, as necessary to run a quantum algorithm on the apparatus 1. The compiler can accordingly come to determine batches of operations to be performed on the qubits 55. The sequencer then decomposes such operations into single-cycle operations, which can include operations such as single- and two-qubit operations.

In variants, the device 10 can actually be configured as a switch 10 for switching RF signals applied to the channel 102, e.g., for multiplexing purposes, as discussed earlier. The devices 10 can possibly be arranged on an upper stage 61-64 of the apparatus 1, as long as superconductivity can be maintained in the respective channel 102.

In other variants, a plurality of devices 10 are used, which are configured as frequency-tunable filters, the cut-off frequency of which can be adjusted, similar to Purcell filters used to increase the coherence of qubits (e.g., while keeping pulses short), for readout purposes. That is, each frequency-tunable filter is connected to a respective quantum circuit (e.g., a qubit or a readout resonator) to cut off frequencies of signals resonant with the qubits while allowing control signals for readout purposes to pass through.

Note, an apparatus according to embodiments can similarly include a device 11, 12 such as depicted in FIGS. 7, 8, with a control unit (not shown) connected to such devices 11, 12. In particular, the apparatus can comprise an electrical circuit 120, as seen in FIG. 8. The circuit has been described earlier. It essentially includes an inductor 122 formed by the channel, structured as a wire 122. In that case, the control unit is used to adjust the kinetic inductance $L_{kin}$ of the wire 122, so as to adjust the cut-off frequency of the electrical circuit 120.

The above embodiments have been succinctly described in reference to the accompanying drawings and can accommodate a number of variants. Several combinations of the above features can be contemplated. Examples are given in the next section.

2. Specific Embodiments—Technical Implementation Details

2.1 Fast Superconducting Switches and Operation Thereof

This section describes fast superconducting switches and operation thereof, wherein the switches have a ultra-high gate impedance (much greater than 1 GΩ) and operate via injection of high-energy electrons through an insulating barrier, and are capable of self-resetting.

A typical device is shown in FIG. 1A. This device is essentially similar to the device discussed in reference to FIG. 6 in sect. 1. The device comprises a metallic nanowire with a side gate, all deposited on an insulating substrate. Application of a gate voltage $V_G$ results in the flow of a current $I_G$ between the gate and the nanowire, where the current depends exponentially on $V_G$. Concomitant to the onset of $I_G$, superconductivity in the nanowire is weakened and eventually suppressed. Measurements indicate that relatively few electrons, injected at energies much higher than the superconducting gap, suffice to trigger the generation of a large amount of quasiparticles and quench superconductivity. This mechanism is extremely efficient, allowing suppression of the nanowire source-drain critical current $I_C$ by tens of µA for gate currents below 1 pA. Total suppression of superconductivity is achieved with gate currents between tens of pA to a few nA (depending on the superconductor material in use), contrary to previously demonstrated devices, where gate currents comparable to the nanowire critical current (e.g., a few µA) were needed to operate the devices. That is, such devices rely on low-energy electrons, which are injected via a metallic medium. In addition to these remarkable properties, devices presented here operate similarly for both positive and negative gate voltages, and for the entire temperature and magnetic field ranges in which superconductivity in the nanowire persists, making them applicable to a broader range of environments than Josephson junctions. Finally, the present superconducting switches are extremely compact, can be fabricated in a single lithographic step, and be readily integrated in existing architectures, either directly on the quantum processor level as signal routers, or as cryogenic interfaces between classical, voltage-driven, digital electronics and superconducting, current-driven circuits. The following describes the basic device operation, in terms of critical current and its dependence on the gate voltage, the temperature, and the magnetic field. The characterization is performed with different substrates and superconductors. This sections further discusses how the injected quasiparticles influence superconductivity along the length of the channel, and demonstrates fast electrical switching and self-resetting to the superconducting state. The experimental observations are presented, then the physical origins of the phenomena are discussed, as well as their implications for the designs of the devices.

FIG. 1A shows a superconducting device, with schematics of the measurement setup. The device consists of a 2 µm long, 80 nm wide TiN wire with a TiN side gate. The wire and the side gate are separated by an 80 nm wide gap. The gates and the nanowires were processed using electron beam lithography and dry etching of a TiN film deposited on an intrinsic Si substrate. Measurements were performed by low-frequency lock-in techniques, by passing a source-drain current $I_{SD}$ in the nanowire and recording the resulting voltage V. A gate voltage $V_G$ was applied via a source-measure unit, which also recorded the current $I_G$ entering the gate contact. The second side gate that is visible in FIG. 1A was not operated and left grounded. Further details on materials, samples fabrication, and measurement techniques are reported in sect. 2.2. At $V_G=0$, the nanowire showed a critical current $I_C=45$ µA, measured while sweeping $I_{SD}$ either up or down starting from zero. In contrast, when sweeping $I_{SD}$ from the normal state towards zero, superconductivity was re-established below the re-trapping current $I_R=1$ µA.

Figure 1B:
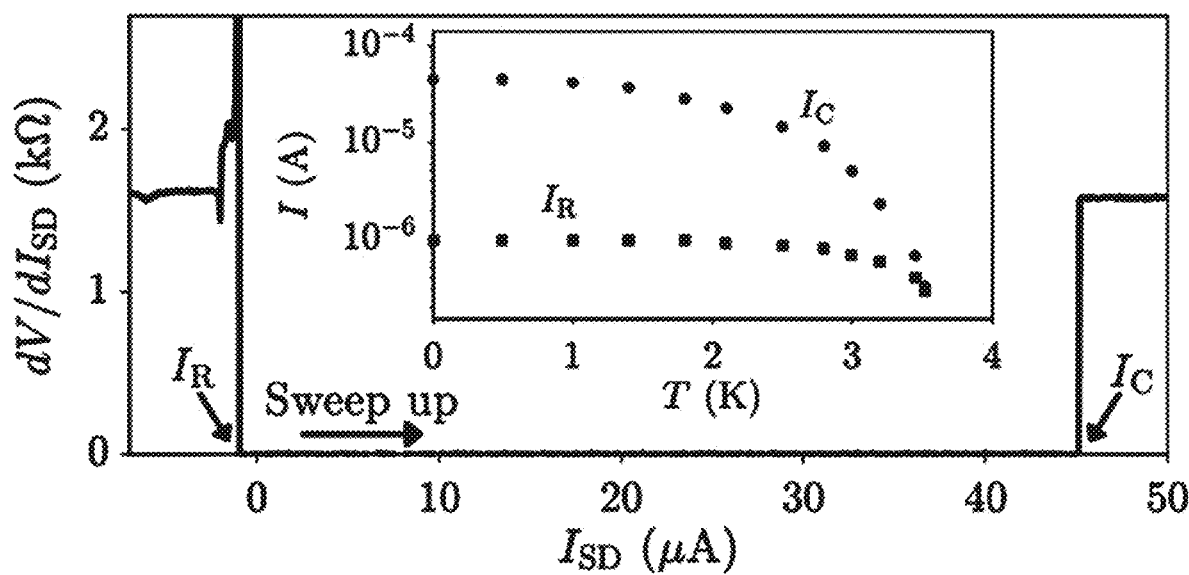

FIG. 1B shows the nanowire differential resistance $dV/dI_{SD}$, measured while sweeping $I_{SD}$ in the positive direction. The inset gives the temperature dependence of $I_C$ and $I_R$. The large difference between $I_C$ and $I_R$, especially marked at low temperature, is likely due to self-heating when the nanowire is in the normal state, together with the difficulty in extracting heat via the substrate or the leads. FIGS. 1C and 1D show $I_C$ and $I_G$, respectively, as a function of $V_G$. For $V_G=\pm2.5$ V, just before $I_G$ reaches the detection level (~100 fA with the measurement setup used), $I_C$ starts decreasing. At $V_G=\pm5.5$ V, where $I_G\approx\pm1$ nA, $I_C$ vanishes and the nanowire reaches its normal state resistance of 1.6 kΩ. The parametric plot of $I_C$ vs. $I_G$ shown in FIG. 1E indicates an extremely fast suppression of $I_C$ for small values of $I_G$ (about 50% of the suppression happens within the noise level for $I_G$), followed by a slower decay, which persists up to $I_G\sim1$ nA.

Figure 2A:
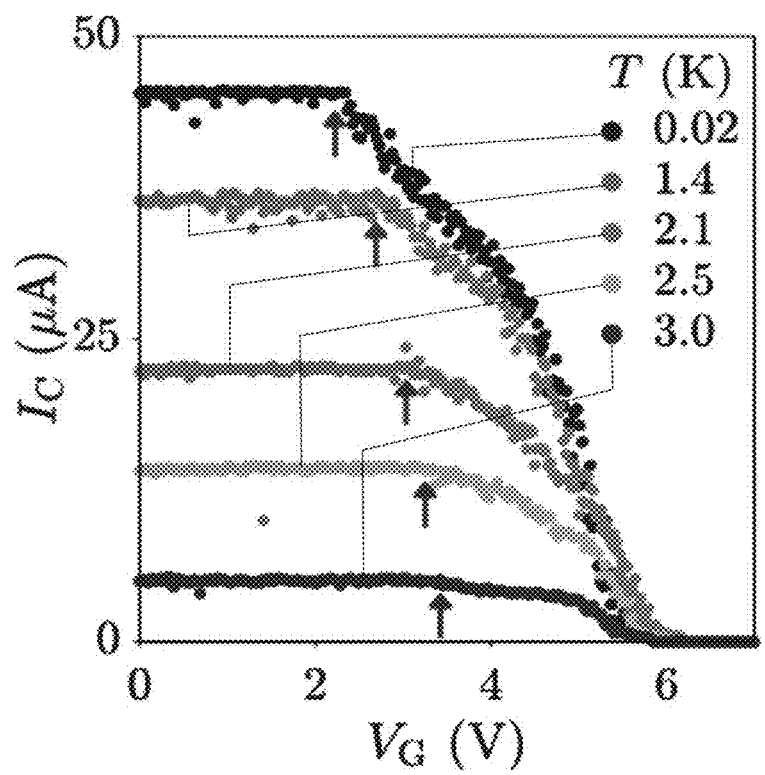
FIGS. 2A and 2B illustrate the dependence on the temperature and the magnetic field.
Figure 2B:
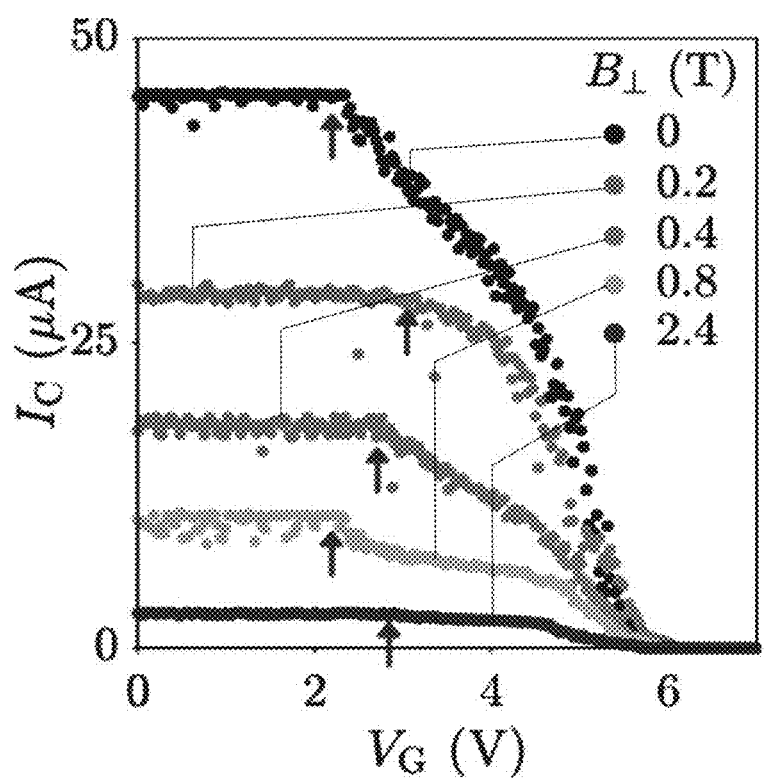

FIGS. 2A and 2B show the gate voltage dependence of $I_C$ for various temperatures T and out-of-plane magnetic fields $B_\perp$, respectively. Neither the temperature nor the magnetic field affects the $I_G$ vs. $V_G$ characteristics of FIG. 1D, and results in identical $V_G$ values for complete suppression of superconductivity in the wires, up to the critical temperature of 3.7 K or the critical field of 3.5 T. On the other hand, the onset of the $I_C$ suppression systematically moves to higher $V_G$ for higher temperatures (see the gray arrows). A more involved dependence on $B_\perp$ is observed.

Figures 3A, 3C:
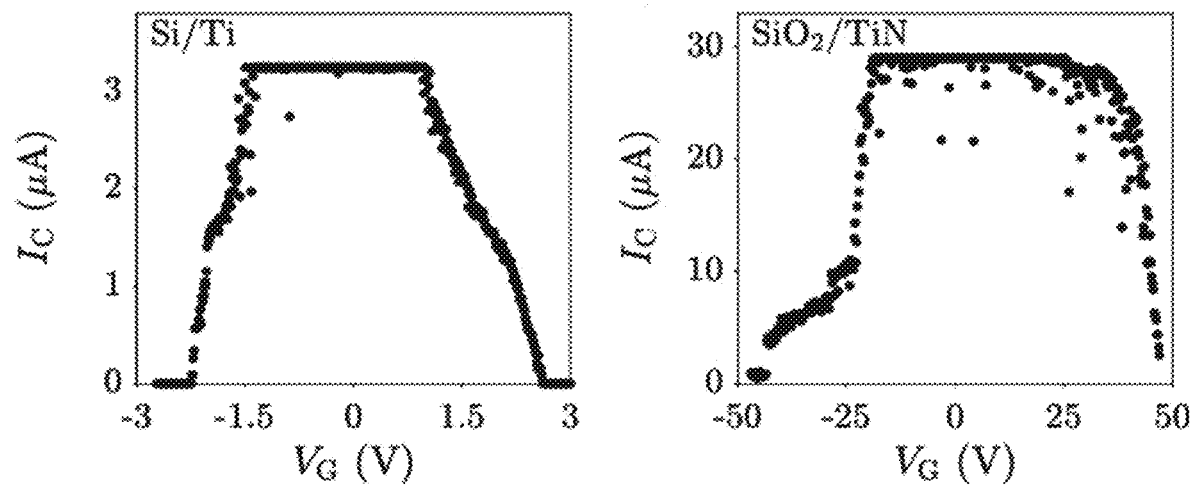
FIGS. 3A-3D illustrate the reproducibility with other materials.
Figures 3B, 3D:
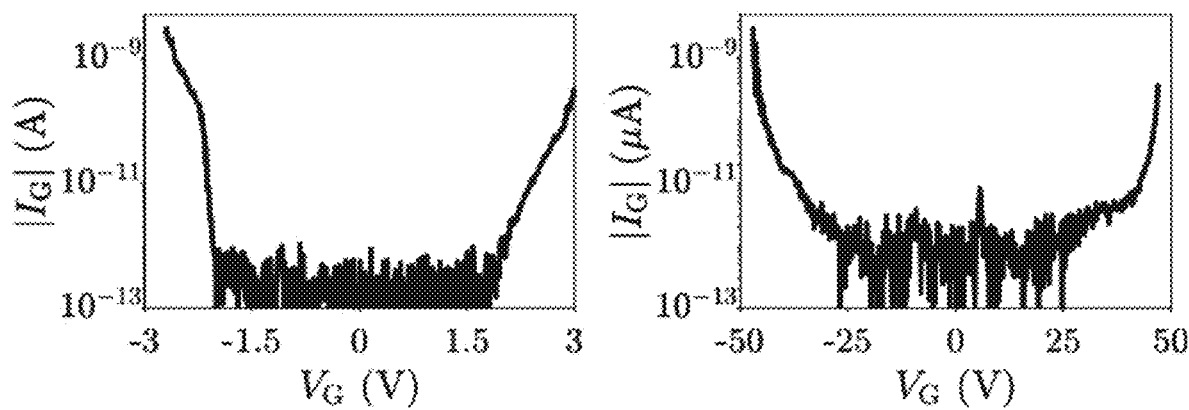

The Inventors were able to observe a suppression of $I_C$ concomitantly with, or at a point in time slightly anticipating, the onset of $I_G$ above the detection level with more than 20 TiN-based devices, having various gate shapes, nanowire widths (e.g., 40, 80, and 200 nm), nanowire lengths (e.g., 650 nm, 1, and 2 µm), and gate-to-wire separation (e.g., 80 and 160 nm). A similar phenomenon was further observed with devices having different substrate materials and superconductor materials. For instance, FIGS. 3A and 3B show the evolution of $I_C$ and $I_G$, respectively, with respect to $V_G$ for a Ti nanowire similar to that of FIG. 1A, but with a 200 nm width. In this case, the normal state was reached for $I_G$ values as low as 40 pA. Further characterization of this nanowire indicates a critical temperature of 220 mK and a normal state resistance of 60Ω. FIGS. 3C and 3D shows measurements performed on a TiN device similar to that of FIG. 1A, though deposited on a 25 nm $SiO_2$ layer that was thermally grown on a Si substrate. Despite the very different operational range of $V_G$ with respect to that of FIG. 1, the suppression of $I_C$ still coincides with the onset of $I_G$. Devices comprising $SiO_2$ further show a characteristic asymmetry of the $I_C$ vs. $V_G$ curve, with a faster suppression of $I_C$ for negative values rather than for positive $V_G$ values. Given the sharp termination of the gate electrode, and the large electric field reached on $SiO_2$ substrates, the extraction of electrons from the gate is expected to be easier for negative gate biases. In the present case, the detection of small gate currents asymmetries is presumably hindered by spurious current leakage in the measurement setup for high gate biases. Overall, these results indicate that the switching mechanism is a general phenomenon, not linked to specific superconducting materials. On the other hand, the data obtained also suggests that weak superconductors require less gate current for the switching mechanism to take place.

Figure 4A:
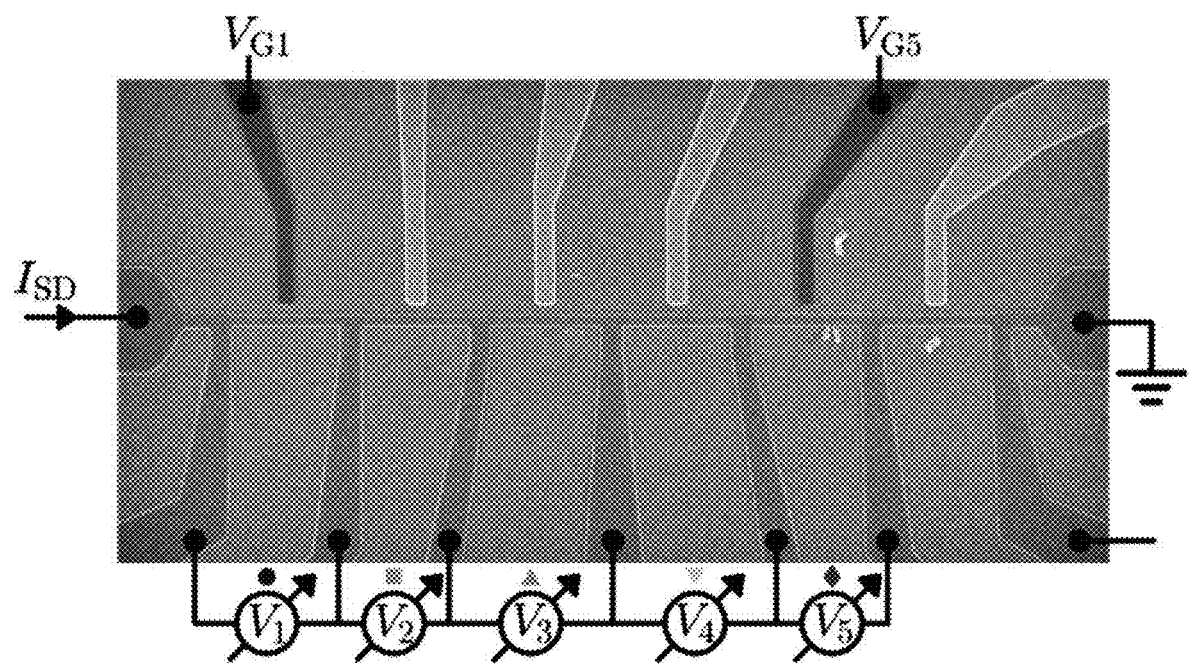
FIGS. 4A-4D address a spatially-resolved suppression of superconductivity.
Figure 4B:
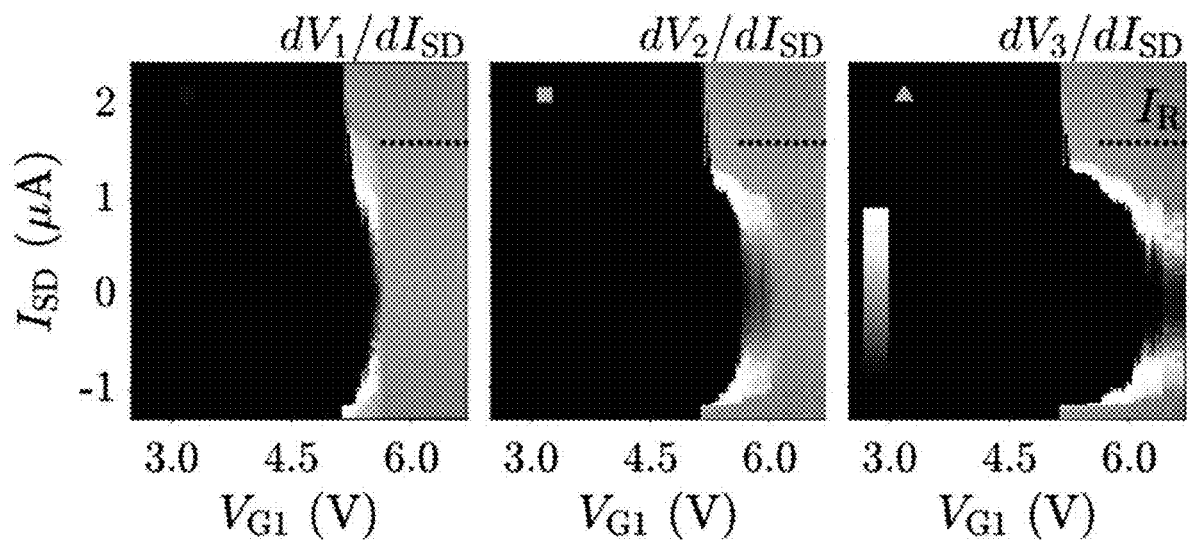
Figure 4C:
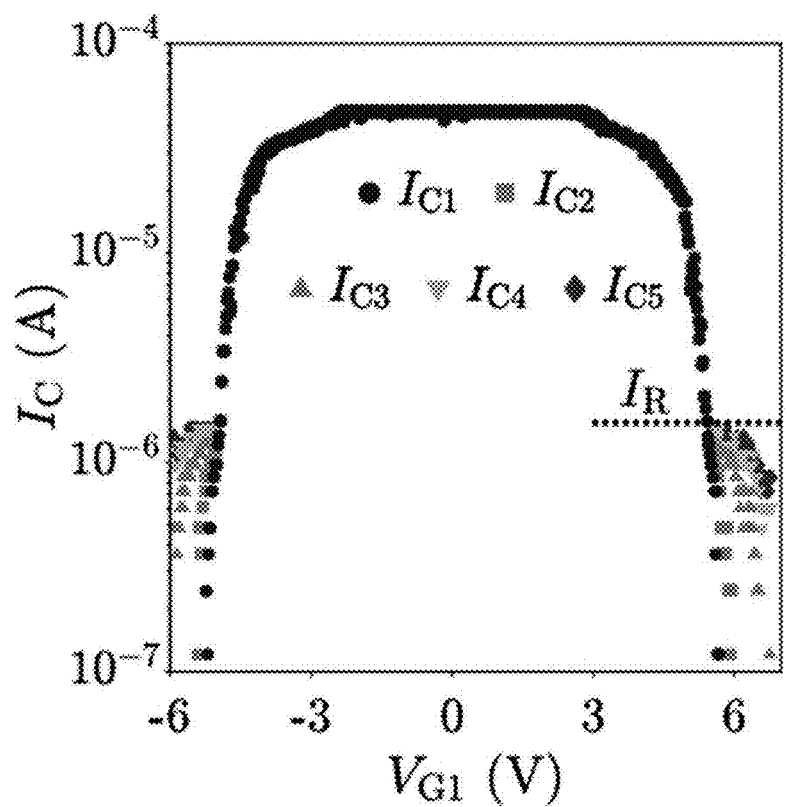
Figure 4D:
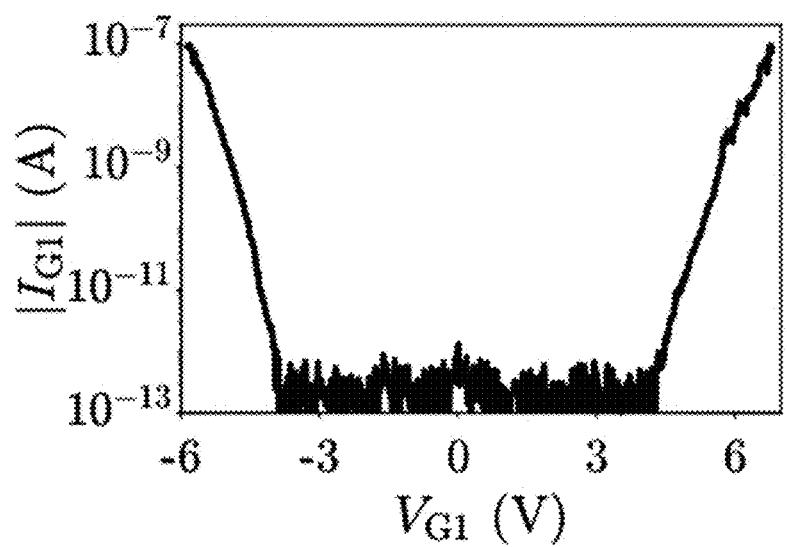
Figure 4E:
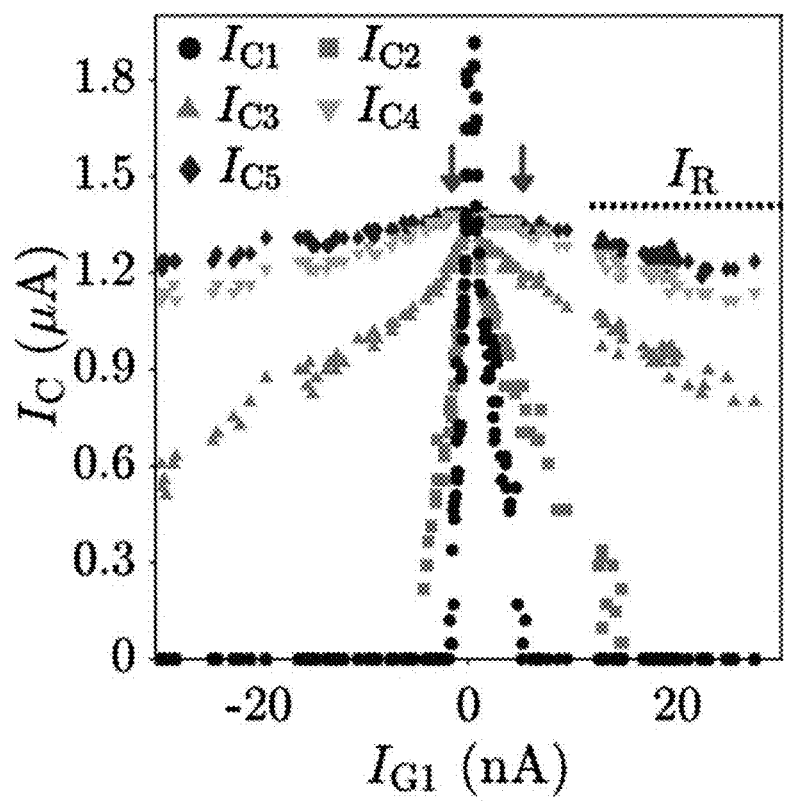
FIG. 4E is a parametric plot of $I_{SWi}$ as a function of $I_{G1}$. Arrows indicate $I_{G1}$ values for which the suppression factor is calculated.

The measurements discussed above were conducted for relatively short nanowires, where sharp transitions from zero to the normal state resistance were observed. The following describes how superconductivity is reduced from the electron injection point along the nanowire length. The device shown in FIG. 4A consists of six TiN segments of 1 µm length and 80 nm width. A current $I_{SD}$ was injected along the nanowire and voltages $V_i$ applied across the first five segments were simultaneously recorded (e.g., the rightmost side contact was left floating). FIG. 4B shows zoom-ins of the differential resistance of the first three segments for $I_{SD}<I_R$. In addition to the varying extension of the zero-resistance state, segments far away from the injection point show an intermediate region where the resistance is larger than zero but below its normal state value. This intermediate regime indicates that normal and superconducting domains coexist in the same wire segment. Critical currents, with markers as indicated in FIG. 4A, are shown in FIG. 4C as a function of $V_{G1}$; the corresponding gate current $I_{G1}$ is shown in FIG. 4D. The parametric plot of $I_C$ vs. $I_{G1}$ is shown in FIG. 4E, which focuses on the region below the re-trapping current $I_R=1.4$ µA. Non-local measurements highlight two distinct regimes. For $I_{SD}>I_R$, all the segments were simultaneously switched: once a local hotspot is created, a Joule heating mechanism warms up the surrounding TiN material in a runaway fashion and the entire channel turns normal. For $I_{SD}<I_R$, sequential switching occurs: the closer a segment is to the biased gate, the less gate current is needed to reach the normal state.

Figure 4F:
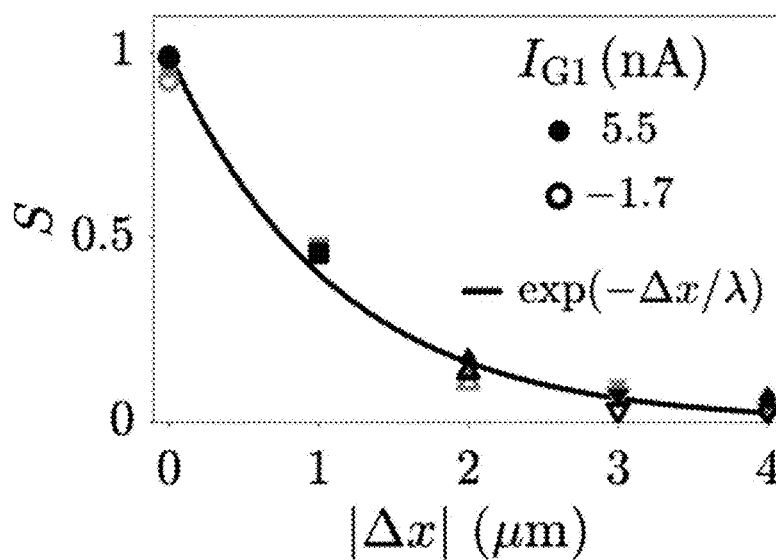
FIG. 4F depicts the suppression factor S as a function of the distance between the gate electrode and the nanowire segment. Black markers denote values obtained by sweeping $I_{G1}$, while gray markers pertain to values obtained by sweeping $I_{G5}$. Full and empty markers refer to positive and negative gate polarities, respectively. The solid line is a fit to an exponential function.

FIG. 4F shows a plot of the critical current suppression factor, defined as $S=(I_R-I_C)$, as a function of the distance $|\Delta x|$ measured between the point of current injection and the center of each segment. Data are extracted for $I_{G1}$ as shown in the legend (e.g., filled markers), corresponding to $|I_G|$ values where $I_{c1}$ vanishes (e.g., see the vertical arrows in FIG. 4E). A similar analysis performed by sweeping $V_{G5}$ is plotted in FIG. 4 with gray markers. Results are highly consistent for both gates and voltage polarities, and do not show dependence on the relative position between the injection point, the measurement point, and the ground contact. The limited data range and the relatively large point-to-point scattering does not allow the functional form of $S(\Delta x)$ to be determined in this case. Fitting the results to an exponentially decaying function $\exp(-\Delta x/\lambda)$, depicted as a solid line in FIG. 4F, yields a characteristic decay length $\Delta\sim1.2$ µm.

Figure 5A:
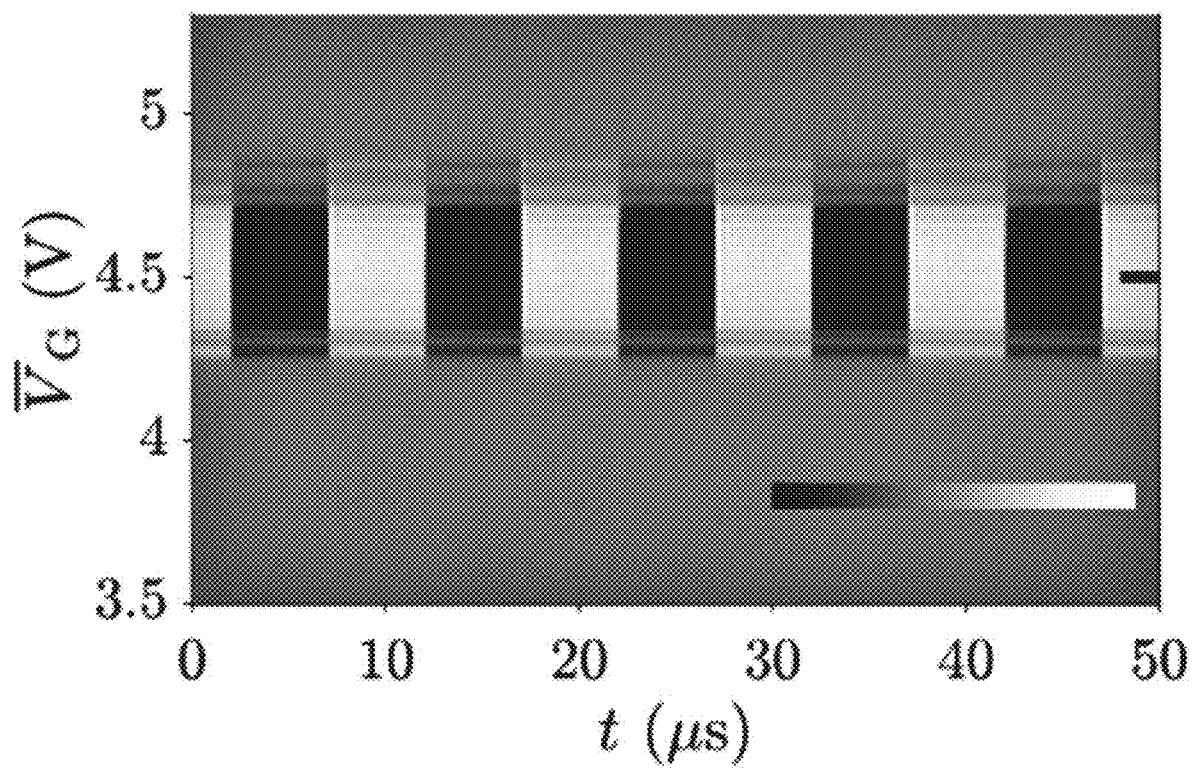
FIGS. 5A-5D illustrate the fast switching mechanism and the self-resetting mechanism. In detail.
Figure 5B:
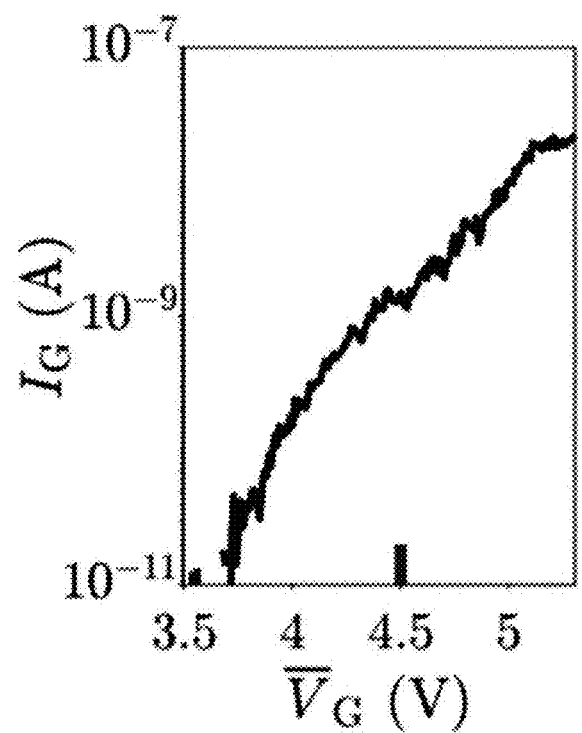
Figure 5C:
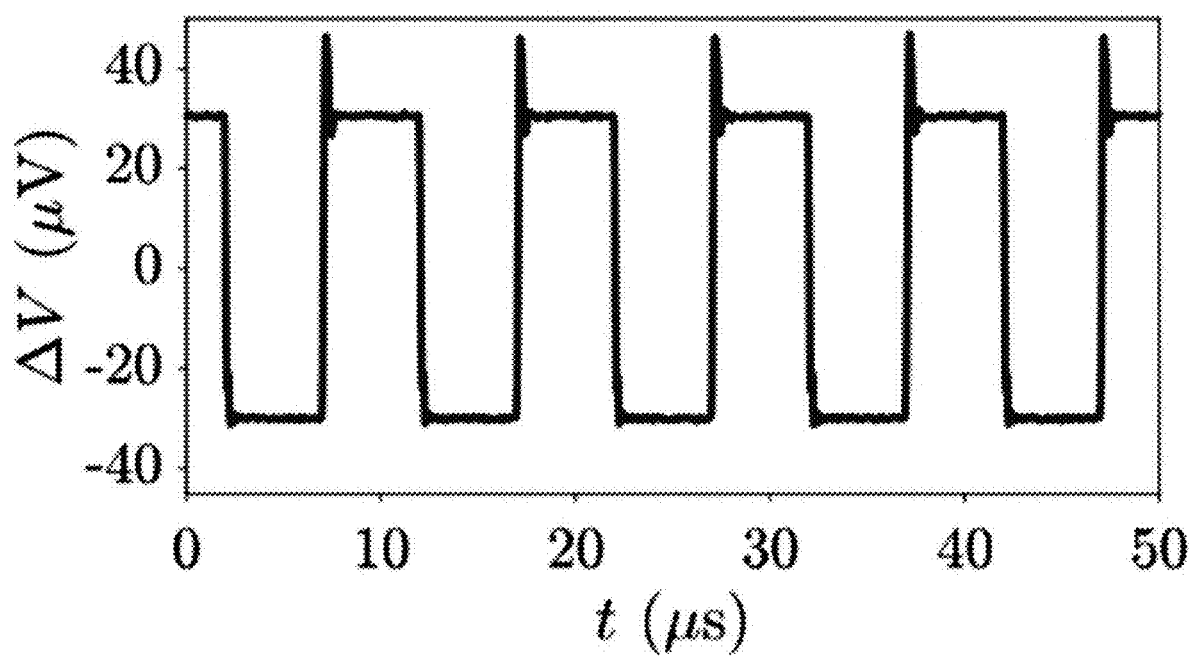
Figure 5D:
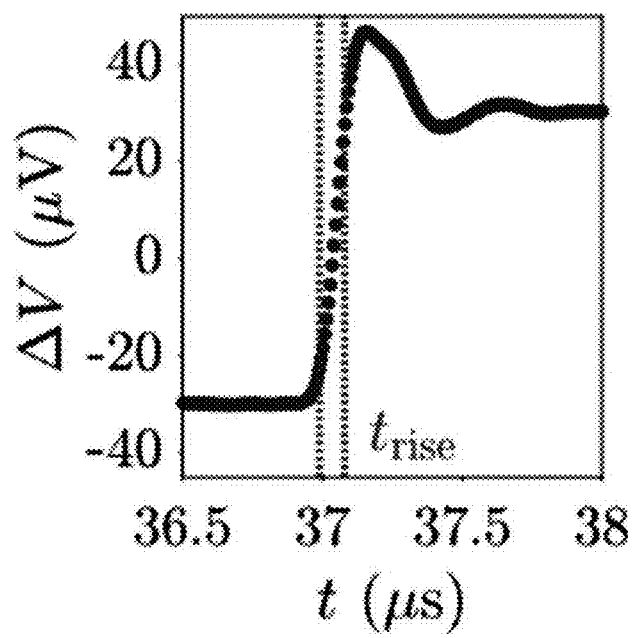

The switching speed of a device similar to that of FIG. 1A was tested by adding a square wave of peak-to-peak amplitude 500 mV and 100 kHz repetition rate to the DC gate bias $V_G$. An AC source-drain current of 100 nA amplitude and 100 MHz frequency is simultaneously passed in the nanowire; the resulting AC voltage drop $\Delta V$ is monitored as a function of time with a lock-in amplifier. As fast signals are applied and measured via low temperature bias-$T_s$, $\Delta V$ is zero on average and reflects the change of circuit impedance between resistive and superconducting nanowire; positive $\Delta V$ values reflect the normal state. FIG. 5A shows the time evolution of $\Delta V$ as a function of $V_G$. The time-averaged gate current is shown in FIG. 5B. A switching operation is achieved within a 500 mV interval around $V_G=4.5$ V, corresponding to a gate current of 1.5 nA. This gate current value is consistent with the results shown in FIG. 1 for reaching full suppression of $I_C$ in the limit of small $I_{SD}$. FIG. 5C shows a time-dependent trace at $V_G=4.5$ V, highlighting fast and reproducible switching between two impedance states. A zoom-in close to a rise point is shown in FIG. 5D, where dashed lines mark the transition between 10% and 90% of the step height, which takes place in 90 ns. Similar results are obtained for the decay time. Such transient equals three times the time constant (e.g., 30 ns) of the lock-in amplifier used and is thus regarded as the ultimate switching time as measurable with the measurement setup used; it can further be considered as an upper limit for the device response time, as discussed in sect. 1. Samples specifically designed for microwave measurements and correlation techniques will be investigated to more precisely assess the device switching speed.

Possible origins of the observed phenomena are now discussed. Electrons emitted from the gate reach the nanowire in a deeply out-of-equilibrium state, with energies on the order of $eV_G$, much larger than the superconducting gap (e.g., 500 μeV for TiN). As electrons relax to the gap edge by inelastic scattering with other electrons and phonons, a large amount of quasiparticles are generated within the nanowire. A sufficiently high concentration of quasiparticles drives the nanowire normal by quenching the superconducting gap and suppressing the de-pairing critical current, which results in switching the channel to the normal state. Such a behavior can possibly evoke superconducting nanowire single photon detectors (SNSPDs), where the strike of a visible or infrared photon promotes single electrons to high energies, which, in turn, triggers the generation of a large amount of quasiparticles as they relax. In the present case, high-energy electrons are provided directly by the gate current, without photons being needed. The present Inventors have shown that the critical current suppression is highest at the point of injection and decreases with distance, with a characteristic length scale on the order of 1 μm. This length scale is presumably associated to the diffusion length of high-energy electrons and relaxation length of generated quasiparticles.

The switching effect discussed herein is notably useful for the fabrication of fast electrical switches with a resistive and a superconducting state, which operate at extremely low gate currents. The ultra-high gate impedance and low-power consumption makes such switches ideal for interfaces between voltage-driven transistors and current-driven superconducting circuits. Quasiparticle relaxation length limits the extension of the segment that can be switched, and consequently the highest normal state resistance of the device. In this context, choosing superconductors with large diffusion length and large normal state resistivity is desirable. Alternatively, nanowires of arbitrary length can be operated by choosing $I_{SD} > I_R$. In this situation, switching from the superconducting to the normal state requires actively resetting $I_{SD}$ to values smaller than $I_R$. For low-current bias, a response time below 90 ns can be achieved, which is limited by the measurement setup use, as discussed earlier. The ultimate switching speed is manifestly determined by the quasiparticle relaxation time in the superconductor, typically below 1 ns. The devices discussed herein can also be used to study quasiparticle physics at unprecedented energy scales and in the limit of no current flowing in the nanowire. Temperature and magnetic field studies reported in FIG. 2 indicate that the gate current needed to completely suppress $I_C$ is a robust property of the system, which can advantageously be used in several applications.

However, FIGS. 2A and 2B show richer physics at lower values of $I_G$; the initial suppression $I_C$ moves to higher and higher gate voltages as temperature increases (see the gray arrows). This behavior presumably reflects the thermodynamic increase of quasiparticle density in the wire, requiring more electrons to be injected before a sizeable effect on $I_C$ is observed.

Other mechanisms are ruled out as source of the suppression of $I_C$. Joule heating in the barrier (due to dissipated power $V_G I_G$ and consequent local temperature increase) is at odds with the absence of temperature dependence for full suppression of $I_C$ in FIG. 2A. The hypothesis that Joule heating does not play a significant role was further tested with additional measurements. Electric field-induced suppression of superconductivity is excluded too, owing to the very small gate voltages applied, the consistent correlation between gate currents and critical currents, and the pronounced non-local responses which extend far beyond the gate-induced electric field (see FIG. 3).

To conclude, the Inventors were able to test multiple devices where superconductivity is modulated or quenched by gate currents that are several orders of magnitude smaller than the source-drain critical current. Devices could be operated in non-latching mode and on fast time scales. Due to the generality and robustness of the presented effect, and the easy device fabrication, such devices can advantageously be used in quantum processing apparatuses and other cryogenic electronics.

2.2 Methods

Sample fabrication. A 20 nm TiN film was deposited on intrinsic Si. Nanowires were obtained by electron beam lithography. A 50 nm thick layer of hydrogen silsesquioxane (HSQ) based negative tone resist was used as mask. After developing the resist, the unprotected TiN areas were removed by inductively coupled plasma etching in HBr plasma. That is, both wires and gates were obtained in a single lithographic step from the same superconducting film. After etching of the TiN, HSQ was removed by immersion in a diluted hydrofluoric acid solution. Characterization of the TiN film gave rise to a 68Ω resistivity per square, a critical temperature of 3.7 K, and a critical out-of-plane magnetic field of 3.5 T. These properties remained unchanged in the final devices. Ti wires were defined by electron beam lithography using a positive tone polymethyl methacrylate mask, electron beam evaporation of a 30 nm thick Ti film, and lift-off. Just prior to evaporation, the chip was briefly immersed in a buffered HF solution for removing the Si native oxide. Ti evaporation was performed at a base pressure of $10^{-9}$ mBar, at a deposition rate of 1 nm s$^{-1}$. The high deposition rate was chosen to minimize contamination of the Ti film during evaporation. For both Ti and TiN wires, normal bonding pads, placed about 100 μm away from the active region of the devices, were defined by optical lithography and Ti/Au evaporation.

Electrical measurements. Electrical measurements were performed in a dilution refrigerator with a base temperature of 10 mK, using standard lock-in techniques. Lowpass filters and high-frequency filters were installed along each line. A DC source-drain current $I_{SD}$, superimposed to a small AC component of 30 nA and 113 Hz, was applied to the nanowire via large bias resistors. The AC differential voltage V across the nanowire was then recorded with lock-in amplifiers with 10 MΩ input impedance and used to calculate the differential resistance $dV/dI_{SD}$.

Measurements were recorded with $I_{SD}$ as the fast axis, from negative to positive values. This made it possible to initialize the wires to the superconducting state before starting each sweep. Gate voltages were applied with a Keysight B2902A source-measure unit, which also recorded the current entering the gate contact. To avoid damaging the devices, a compliance of ±100 nA was chosen. A linear contribution of about 1 pAV$^{-1}$, associated to spurious leakage paths in the setup, was subtracted from the $I_G$ measurements discussed in sect. 2.1. First, a linear fit of the low bias $I_G$ vs. $V_G$ curve was performed, the resulting line was then subtracted over the entire $V_G$ range of the measurements. To avoid any contribution from displacement currents, $I_G$ values were recorded with waiting times on the order of 30 s after $V_G$ was stepped.

Measurements in FIG. 5 were performed via resistive bias-$T_s$ (e.g., 50 kΩ resistors and 22 nF capacitors) mounted on the chip carrier, enabling simultaneous applications of DC and AC signals. AC signals were applied via superconducting, non-attenuated coaxial lines. The fast-changing gate voltage was applied via a Keysight signal generator with 80 MHz bandwidth, while the nanowire resistance was measured with a Zurich Instruments, Ultra-High Frequency Lock-in, operated at a base frequency of 100 MHz. An AC current of 100 nA RMS amplitude was passed in the sample and the voltage drop across the nanowire was input to the lock-in amplifier, demodulated, and plotted on a Keysight DSOX2024A oscilloscope with 200 MHz bandwidth. The lock-in was set to the shortest possible time constant (30 ns), corresponding to a measurement bandwidth of 14 MHz.

While the present invention has been described with reference to a limited number of embodiments, variants and the accompanying drawings, it will be understood by those skilled in the art that various changes can be made and equivalents can be substituted without departing from the scope of the present invention. In particular, a feature (e.g., device-like or method-like) recited in a given embodiment, variant or shown in a drawing can be combined with or replace another feature in another embodiment, variant or drawing, without departing from the scope of the present invention. Various combinations of the features described in respect of any of the above embodiments or variants can accordingly be contemplated, that remain within the scope of the appended claims. In addition, many minor modifications can be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly mentioned can be contemplated.

What is claimed is:

1. A method of operating a superconducting channel, the method comprising:
    providing a device comprising:
        an electrical circuit including an inductor,
        a channel defined by a superconducting material, wherein the channel is structured as a wire,
        a gate positioned adjacent to the channel, such that an end surface of the gate faces a portion of the channel, wherein a gap exists between the end surface of the gate and the portion of the channel, and
        an electrically insulating medium arranged at least within the gap so as to electrically insulate the gate from the channel, and
        a control unit connected to the gate and the channel;
    rendering the channel superconducting by cooling down the device to a cryogenic temperature;
    applying, by the control unit, a voltage difference between the gate and the channel to inject electrons from the end surface of the gate into the channel through the electrically insulating medium, and thereby generate a gate current between the gate and the channel, wherein the electrons are injected with an average energy sufficient to modify a critical current of the channel during operation of the device at the cryogenic temperature;
    adjusting, by the control unit, a kinetic inductance of the wire so as to adjust one of a resonant frequency or a cut-off frequency of the electrical circuit;
    applying, by the control unit, a signal to the channel and altering the signal applied by modifying the critical current during the operation; and
    allowing, by the control unit, a property of the channel or a property implied by the property of the channel to be measured during the operation, and the applied voltage difference to be controllably modified according to the measured property so as to adjust the property of the channel or the property implied by the property during the operation.

2. The method according to claim 1, wherein the applying the voltage difference lowers the critical current to zero and thereby generates an electrical resistance in the channel at least locally at the portion of the channel.

3. The method according to claim 2, wherein the method further comprises:
    switching off the voltage difference applied for the potentially superconducting material to self-reset to a fully superconducting state.

4. The method according to claim 2, wherein the applied voltage difference corresponds to a minimum value required to switch the channel to a normal state thereof, and wherein an impedance of the gate, as determined by the electrically insulating medium, is larger than 1 GΩ.

5. The method according to claim 1, wherein an intensity of the gate current generated upon applying the voltage difference is at least ten times less than the critical current.

6. The method according to claim 1, wherein an intensity of the gate current generated upon applying the voltage difference is between 10 pA and 10 nA.

7. The method according to claim 1, wherein the voltage difference is applied such that the average energy is at least 100 times larger than a superconducting gap of the potentially superconducting material.

8. An apparatus comprising:
    an electrical circuit including an inductor;
    a device comprising:
        a channel defined by a superconducting material, the device configured to be operated at cryogenic temperatures that render the channel superconducting, wherein the channel is structured as a wire,
        a gate positioned adjacent to the channel, such that an end surface of the gate faces a portion of the channel, wherein a gap exists between the end surface of the gate and the portion of the channel, and
        an electrically insulating medium arranged at least within the gap so as to electrically insulate the gate from the channel; and
    a control unit connected to the gate and the channel, the control unit being configured to:
        apply a voltage difference between the gate and the channel so as to inject electrons from the end surface of the gate into the channel through the electrically insulating medium, and thereby generate a gate current between the gate and the channel, wherein an average energy of the electrons is sufficient to modify a critical current of the channel during operation of the device at the cryogenic temperatures,
        adjust a kinetic inductance of the wire so as to adjust one of a resonant frequency or a cut-off frequency of the electrical circuit, apply a signal to the channel and alter the signal applied by modifying the critical current during the operation, and allow a property of the channel or a property implied by the property of the channel to be measured during the operation, and the applied voltage difference to be controllably modified according to the measured property so as to adjust the property of the channel or the property implied by the property during the operation.

9. The apparatus according to claim 8, wherein the device comprises a substrate forming the electrically insulating medium, and each of the gate and the wire are structured on the substrate.

10. The apparatus according to claim 9, wherein a width of the wire is between 40 and 300 nm, and the gap between the end surface of the gate and the portion of the channel is between 40 nm and 300 nm, the width and the gap being measured parallel to a main surface of the substrate.

11. The apparatus according to claim 8, wherein the potentially superconducting material comprises at least one member selected from the group consisting of: Ti, TiN, Nb, W, WSi, Al, and Mo.

12. The apparatus according to claim 8, wherein the apparatus is configured as a quantum processing apparatus, which additionally include quantum circuits, and the channel of the device is connected to one or more of the quantum circuits.

* * * * *